US012796075B2

(12) United States Patent
Kim et al.

(10) Patent No.: US 12,796,075 B2
(45) Date of Patent: Nov. 10, 2026

(54) SEMICONDUCTOR DEVICE INCLUDING LOWER NANOSHEETS, UPPER NANOSHEETS AND AN ISOLATION LAYER BETWEEN THE LOWER AND UPPER NANOSHEETS

(71) Applicant: Samsung Electronics Co., Ltd., Suwon-si (KR)

(72) Inventors: Kyung Soo Kim, Suwon-si (KR); Sung Min Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 636 days.

(21) Appl. No.: 18/109,296

(22) Filed: Feb. 14, 2023

(65) Prior Publication Data

US 2023/0369332 A1 Nov. 16, 2023

(30) Foreign Application Priority Data

May 10, 2022 (KR) ........................ 10-2022-0057076

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC ............. H10D 64/518; H10D 84/0151; H10D 84/0188; H10D 30/014; H10D 30/43;
(Continued)

(56) References Cited

U.S. PATENT DOCUMENTS 10,090,205 B2 10/2018 Fung
10,998,423 B2 5/2021 Le et al.
(Continued)

FOREIGN PATENT DOCUMENTS

CN 108878535 A 11/2018
EP 4135019 A1 2/2023
(Continued)

OTHER PUBLICATIONS

"European Office Action in Corresponding Application No. 2312676.1, mailed Dec. 18, 2023, 8 pages".

(Continued)

*Primary Examiner* — William B Partridge
*Assistant Examiner* — Ilker Ozden
(74) *Attorney, Agent, or Firm* — Wolf, Greenfield & Sacks, P.C.

(57) ABSTRACT

There is provided a semiconductor device in which a shape of an isolation layer in a structure in which upper nanosheets are stacked on lower nanosheets is controlled to improve reliability of the device. The semiconductor device includes an active pattern on a substrate and extending in a first direction, lower nanosheets spaced apart from each other in a second direction intersecting the first direction and on the active pattern, an isolation layer on the lower nanosheets and spaced apart from the lower nanosheets in the second direction, upper nanosheets spaced apart from each other in the second direction and on the isolation layer, and a gate electrode on the substrate and surrounding each of the lower nanosheets, the isolation layer, and the upper nanosheets, wherein a sidewall of the isolation layer has a curved shape.

20 Claims, 36 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2026.01) |
| ***H10D 84/03*** | (2025.01) |
| ***H10D 88/00*** | (2026.01) |

(52) U.S. Cl.
CPC ....... *H10D 30/6735* (2025.01); *H10D 62/121* (2025.01); *H10D 62/151* (2025.01); *H10D 84/0167* (2025.01); *H10D 84/017* (2025.01); *H10D 84/0188* (2025.01); *H10D 84/038* (2025.01); *H10D 88/01* (2025.01)

(58) Field of Classification Search
CPC ............. H10D 30/6735; H10D 84/856; H10D 62/121; H10D 62/151; H10D 84/0167; H10D 84/017; H10D 84/038; H10D 88/01; H10D 64/017; H10D 64/015; H10D 30/6757; H10D 64/689; H10D 64/256; H10D 84/83; H10D 88/00; H10D 84/813
See application file for complete search history.

(56) References Cited

U.S. PATENT DOCUMENTS

| | | | | |
|---|---|---|---|---|
| 11,164,793 | B2 | 11/2021 | Xie et al. | |
| 2019/0172828 | A1* | 6/2019 | Smith .................... | H10D 88/00 |
| 2020/0266218 | A1* | 8/2020 | Lilak ...................... | B82Y 10/00 |
| 2020/0411511 | A1 | 12/2020 | Rachmady et al. | |
| 2021/0083079 | A1 | 3/2021 | Chiang et al. | |
| 2022/0013652 | A1 | 1/2022 | Yang et al. | |
| 2023/0037957 | A1* | 2/2023 | Thomas ................. | H10D 30/43 |
| 2023/0178553 | A1* | 6/2023 | Xie ...................... | H10D 30/014 257/351 |
| 2023/0307456 | A1* | 9/2023 | Lin .................... | H10D 30/6728 |

FOREIGN PATENT DOCUMENTS

| | | | |
|---|---|---|---|
| EP | 4191654 | A1 | 6/2023 |
| EP | 4270462 | A1 | 11/2023 |
| KR | 10-2022-0034337 | A | 3/2022 |
| KR | 10-2022-0044636 | A | 4/2022 |
| KR | 10-2845466 | B1 | 8/2025 |
| KR | 10-2847543 | B1 | 8/2025 |

OTHER PUBLICATIONS

"European Search Report for Corresponding Application No. 23172676.1, mailed Dec. 6, 2023, 5 pages".

* cited by examiner

SEMICONDUCTOR DEVICE INCLUDING LOWER NANOSHEETS, UPPER NANOSHEETS AND AN ISOLATION LAYER BETWEEN THE LOWER AND UPPER NANOSHEETS

CROSS-REFERENCE TO RELATED APPLICATION

This application claims priority from Korean Patent Application No. 10-2022-0057076 filed on May 10, 2022 in the Korean Intellectual Property Office, and all the benefits accruing therefrom under 35 U.S.C. 119, the contents of which in its entirety are herein incorporated by reference.

BACKGROUND

Technical Field

The present disclosure relates to a semiconductor device. More specifically, the present disclosure relates to a semiconductor device including a multi-bridge channel and to a method for manufacturing the same.

Background

One of the scaling schemes for increasing integration of a semiconductor device includes a multi-gate transistor in which a silicon body in a shape of a fin or a nanowire is formed on a substrate and a gate is formed on a surface of the silicon body.

Because the multi-gate transistor uses a three-dimensional channel, it is easy to scale the multi-gate transistor. Further, current control ability of the multi-gate transistor may be improved without increasing a gate length of the multi-gate transistor. In addition, the multi-gate transistor may effectively suppress SCE (short-channel effect) in which a potential of a channel area is affected by a drain voltage.

SUMMARY

A purpose of the present disclosure is to provide a semiconductor device in which a shape of an isolation layer in a structure in which a plurality of upper nanosheets are stacked on a plurality of lower nanosheets is controlled to improve reliability of the device.

Purposes according to the present disclosure are not limited to the above-mentioned purpose. Other purposes and advantages according to the present disclosure that are not mentioned may be understood based on the following descriptions and may be more clearly understood based on embodiments according to the present disclosure. Further, it will be easily understood that the purposes and advantages according to the present disclosure may be realized using means shown in the claims and combinations thereof.

According to an aspect of the present disclosure, there is provided a semiconductor device comprising an active pattern on a substrate and extending in a first direction, a plurality of lower nanosheets spaced apart from each other in a second direction intersecting the first direction and on the active pattern, an isolation layer on the plurality of lower nanosheets and spaced apart from the plurality of lower nanosheets in the second direction, a plurality of upper nanosheets spaced apart from each other in the second direction and on the isolation layer, and a gate electrode on the substrate and surrounding each of the plurality of lower nanosheets, the isolation layer, and the plurality of upper nanosheets, wherein a sidewall of the isolation layer has a curved shape.

According to another aspect of the present disclosure, there is provided a semiconductor device comprising an active pattern on a substrate and extending in a first horizontal direction, a plurality of lower nanosheets spaced apart from each other in a vertical direction from the substrate and on the active pattern, an isolation layer on the plurality of lower nanosheets and spaced apart from the plurality of lower nanosheets in the vertical direction, a plurality of upper nanosheets spaced apart from each other in the vertical direction and on the isolation layer, and a gate electrode on the substrate and extending in a second horizontal direction intersecting the first horizontal direction, wherein the gate electrode surrounds each of the plurality of lower nanosheets, the isolation layer, and the plurality of upper nanosheets, wherein a width of the isolation layer in the second horizontal direction is the smallest or largest at a first vertical level thereof closest to a stack of the plurality of lower nanosheets and/or at a second vertical level thereof closest to a stack of the plurality of upper nanosheets.

According to still another aspect of the present disclosure, there is provided a semiconductor device comprising a substrate, an active pattern on the substrate and extending in a first horizontal direction, wherein the active pattern protrudes from the substrate in a vertical direction, a first plurality of lower nanosheets spaced apart from each other in the vertical direction and on the active pattern, a second plurality of lower nanosheets spaced apart from each other in the vertical direction and on the active pattern, wherein the first plurality of lower nanosheets are spaced apart from the second plurality of lower nanosheets in the first horizontal direction, a first plurality of upper nanosheets spaced apart from each other in the vertical direction and on the first plurality of lower nanosheets, wherein the first plurality of upper nanosheets are spaced apart from the first plurality of lower nanosheets in the vertical direction, a second plurality of upper nanosheets spaced apart from each other in the vertical direction and on the second plurality of lower nanosheets, wherein the second plurality of upper nanosheets are spaced apart from the second plurality of lower nanosheets in the vertical direction, a first isolation layer between the first plurality of lower nanosheets and the first plurality of upper nanosheets, a second isolation layer between the second plurality of lower nanosheets and the second plurality of upper nanosheets, wherein the first isolation layer and the second isolation layer are spaced apart from each other in the first horizontal direction, a first gate electrode on the active pattern and extending in a second horizontal direction different from the first horizontal direction, wherein the first gate electrode surrounds each of the first plurality of lower nanosheets, the first isolation layer, and the first plurality of upper nanosheets, and a second gate electrode on the active pattern and extending in the second horizontal direction, wherein the second gate electrode is spaced apart from the first gate electrode in the first horizontal direction, wherein the second gate electrode surrounds each of the second plurality of lower nanosheets, the second isolation layer, and the second plurality of upper nanosheets, wherein an inclination angle of a sidewall of the first isolation layer is different from an inclination angle of a sidewall of the second isolation layer.

BRIEF DESCRIPTION OF THE DRAWINGS

The above and other aspects and features of the present disclosure will become more apparent by describing in detail illustrative embodiments thereof with reference to the attached drawings, in which.

DETAILED DESCRIPTION

Hereinafter, a semiconductor device according to some embodiments of the present disclosure will be described with reference to FIGS. 1 to 4.

Figure 1:
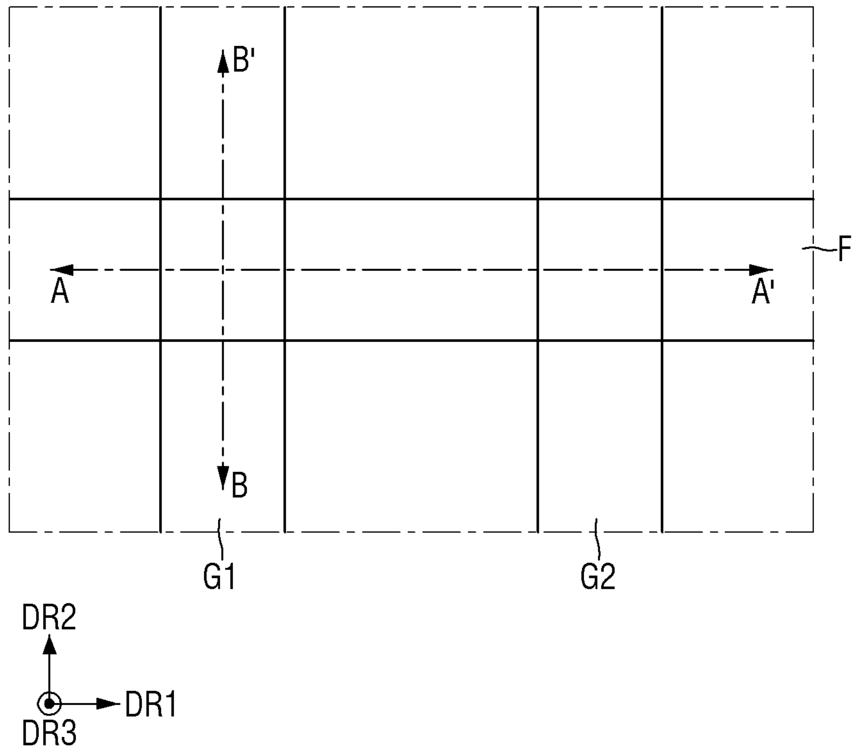
FIG. 1 is a layout diagram for illustrating a semiconductor device according to some embodiments of the present disclosure.
Figure 2:
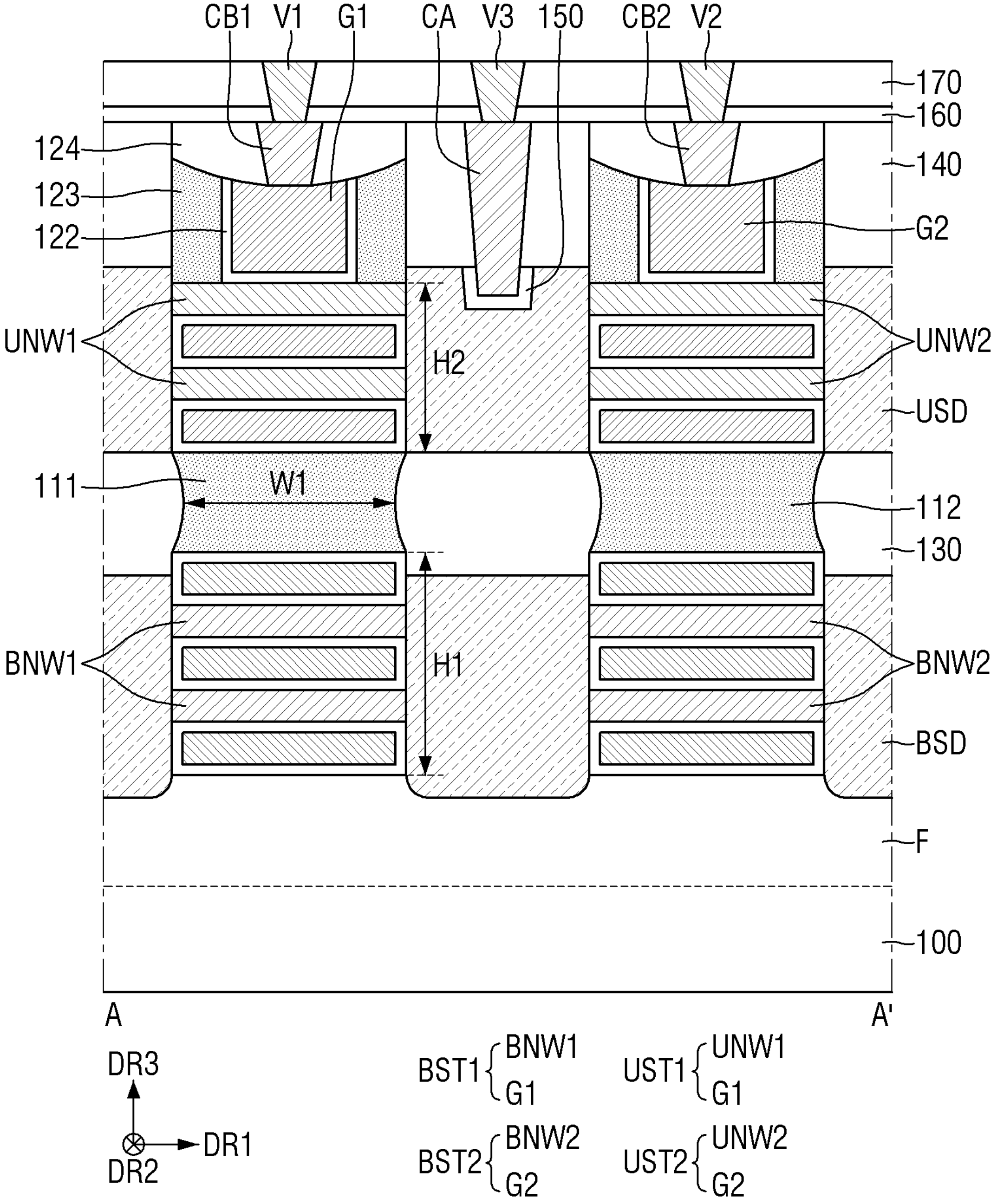
FIG. 2 is a cross-section view cut along a line A-A' in FIG. 1.
Figure 3:
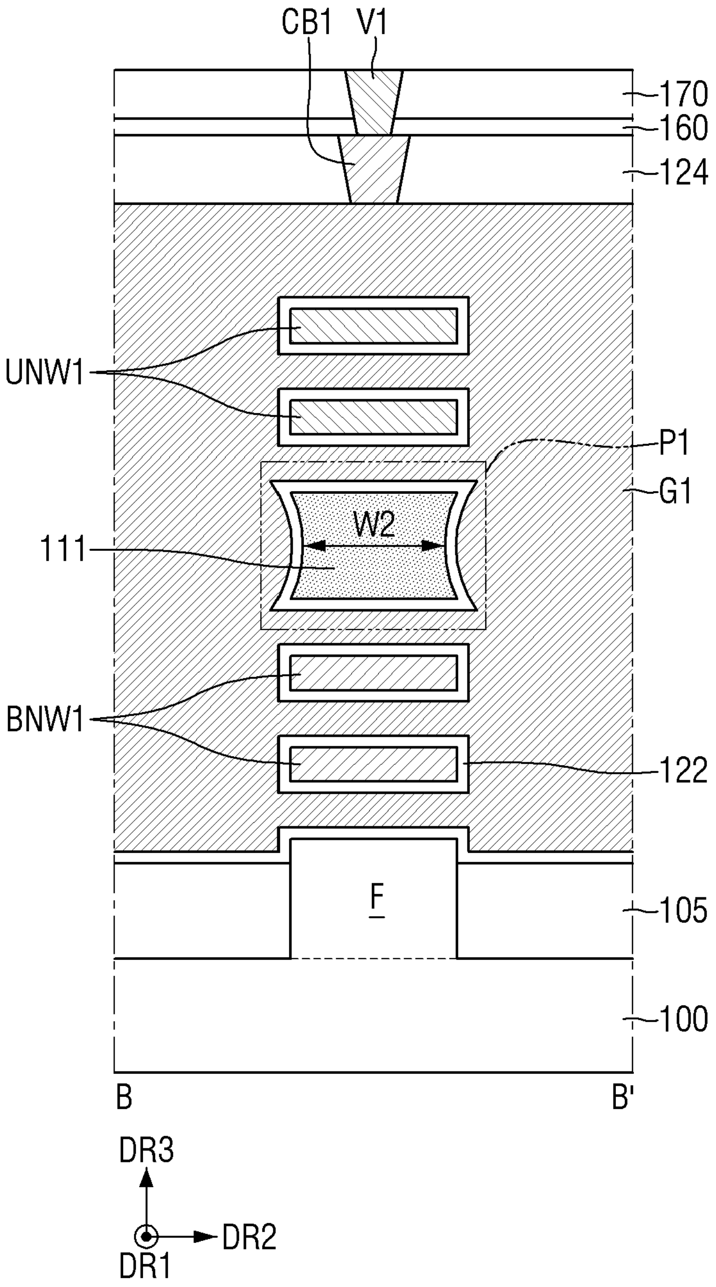
FIG. 3 is a cross-section view cut along a line B-B' in FIG. 1.
Figure 4:
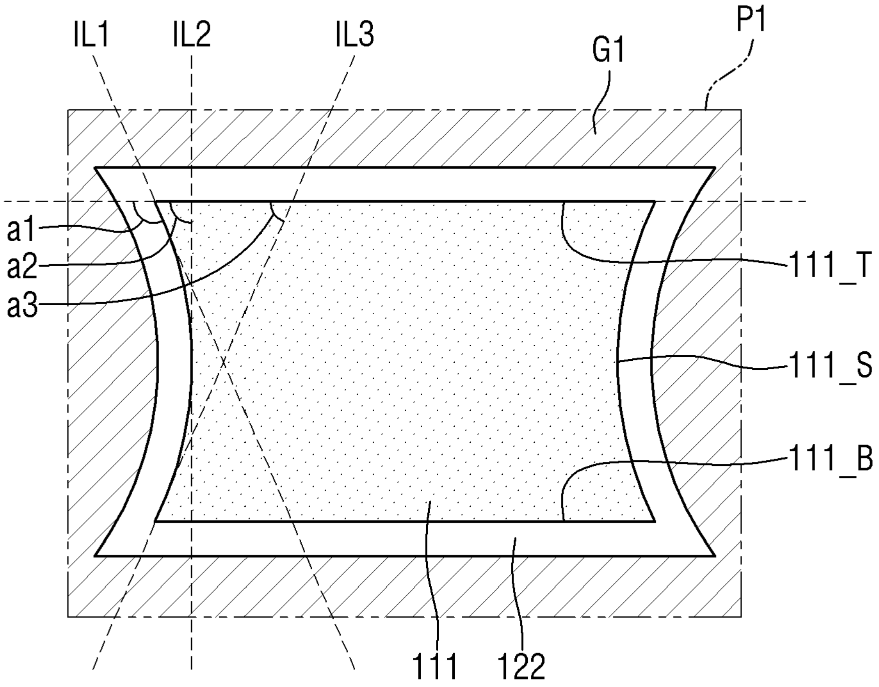
FIG. 4 is an enlarged view of an area P1 of FIG. 3.

FIG. 1 is a layout diagram for illustrating a semiconductor device according to some embodiments of the present disclosure. FIG. 2 is a cross-section view cut along a line A-A' in FIG. 1. FIG. 3 is a cross-section view cut along a line B-B' in FIG. 1. FIG. 4 is an enlarged view of an area P1 of FIG. 3.

Referring to FIGS. 1 to 4, the semiconductor device according to some embodiments of the present disclosure includes a substrate 100, an active pattern F, a field insulating film 105, first and second plurality of lower nanosheets BNW1 and BNW2, first and second plurality of upper nanosheets UNW1 and UNW2, a first isolation layer 111, a second isolation layer 112, first and second gate electrodes G1 and G2, a gate insulating film 122, a gate spacer 123, a capping pattern 124, a lower source/drain region BSD, an upper source/drain region USD, a first interlayer insulating film 130, a second interlayer insulating film 140, first and second gate contacts CB1 and CB2, a source/drain contact CA, a silicide layer 150, an etch stop film 160, a third interlayer insulating film 170, and first to third vias V1, V2, and V3.

The substrate 100 may be a silicon substrate or an SOI (silicon-on-insulator). Alternatively, the substrate 100 may include silicon germanium, SGOI (silicon germanium on insulator), indium antimonide, a lead telluride compound, indium arsenide, indium phosphide, gallium arsenide or gallium antimonide. However, the present disclosure is not limited thereto.

The active pattern F may protrude from the substrate 100 in a third direction DR3. In this regard, a first direction DR1 and a second direction DR2 may, respectively, refer to a first horizontal direction and a second horizontal direction intersecting each other on the substrate 100. The third direction DR3 may be defined as a direction perpendicular to a plane defined by the first direction DR1 and the second direction DR2. The active pattern F may be a portion of the substrate 100, or may include an epitaxial layer grown from the substrate 100. The active pattern F may extend in the first direction DR1.

The field insulating film 105 may be disposed on the substrate 100. The field insulating film 105 may surround a sidewall of the active pattern F. For example, an upper surface of the active pattern F may protrude in the third direction DR3 beyond an upper surface of the field insulating film 105. However, the present disclosure is not limited thereto. In some other embodiments, the upper surface of the active pattern F may be coplanar with the upper surface of the field insulating film 105.

The first plurality of lower nanosheets BNW1 may be disposed on the active pattern F. The first plurality of lower nanosheets BNW1 may include a plurality of nanosheets spaced apart from each other in the third direction DR3 and stacked on the active pattern F. The second plurality of lower nanosheets BNW2 may be disposed on the active pattern F. The second plurality of lower nanosheets BNW2 may be spaced apart from the first plurality of lower nanosheets BNW1 in the first direction DR1. The second plurality of lower nanosheets BNW2 may include a plurality of nanosheets spaced apart from each other in the third direction DR3 and stacked on the active pattern F.

In FIGS. 2 and 3, each of the first plurality of lower nanosheets BNW1 and the second plurality of lower nanosheets BNW2 is shown as including two nanosheets stacked in the third direction DR3. However, this is for convenience of illustration. In some other embodiments, each of the first plurality of lower nanosheets BNW1 and the second plurality of lower nanosheets BNW2 may include three or more nanosheets stacked in the third direction DR3. Each of the first plurality of lower nanosheets BNW1 may include, for example, silicon (Si). Each of the second plurality of lower nanosheets BNW2 may include, for example, silicon (Si).

The first plurality of upper nanosheets UNW1 may be disposed on the first plurality of lower nanosheets BNW1. The first plurality of upper nanosheets UNW1 may be spaced apart from the first plurality of lower nanosheets BNW1 in the third direction DR3. The first plurality of upper nanosheets UNW1 may include a plurality of nanosheets spaced apart from each other in the third direction DR3 and stacked on the first plurality of lower nanosheets BNW1.

The second plurality of upper nanosheets UNW2 may be disposed on the second plurality of lower nanosheets BNW2. The second plurality of upper nanosheets UNW2 may be spaced apart from the second plurality of lower nanosheets BNW2 in the third direction DR3. The second plurality of upper nanosheets UNW2 may be spaced apart from the first plurality of upper nanosheets UNW1 in the first direction DR1. The second plurality of upper nanosheets UNW2 may include a plurality of nanosheets spaced apart from each other in the third direction DR3 and stacked on the second plurality of lower nanosheets BNW2.

In FIGS. 2 and 3, each of the first plurality of upper nanosheets UNW1 and the second plurality of upper nanosheets UNW2 is shown as including two nanosheets stacked in the third direction DR3. However, this is for convenience of illustration. In some other embodiments, each of the first plurality of upper nanosheets UNW1 and the second plurality of upper nanosheets UNW2 may include three or more nanosheets stacked in the third direction DR3. Each of the first plurality of upper nanosheets UNW1 may include, for example, silicon (Si). Each of the second plurality of upper nanosheets UNW2 may include, for example, silicon (Si).

The first isolation layer 111 may be disposed between the first plurality of lower nanosheets BNW1 and the first plurality of upper nanosheets UNW1. The first isolation layer 111 may be spaced apart from the first plurality of lower nanosheets BNW1 and the first plurality of upper nanosheets UNW1 in the third direction DR3.

A profile of each of opposing sidewalls of the first isolation layer 111 may have a concave shape. Each of opposing sidewalls of the first isolation layer 111 may be recessed inwardly of the first isolation layer 111.

Referring to FIGS. 3 and 4, the first isolation layer 111 may further include a bottom face 111_B closest to the first plurality of lower nanosheets BNW1, a top face 111_T closest to the first plurality of upper nanosheets UNW1 and opposite to the bottom face 111_B, and a sidewall 111_S connecting the bottom face 111_B and the top face 111_T to each other.

Imaginary lines IL1, IL2, and IL3 related to the sidewall 111_S of the first isolation layer 111 are assumed. An angle a2 in the counterclockwise direction between the top face 111_T of the first isolation layer 111 and the second imaginary line IL2 is smaller than an angle a1 in the counterclockwise direction between the top face 111_T of the first isolation layer 111 and the first imaginary line IL1. An angle a3 in the counterclockwise direction between the top face 111_T of the first isolation layer 111 and the third imaginary line IL3 is smaller than the angle a2 in the counterclockwise direction between the top face 111_T of the first isolation layer 111 and the second imaginary line IL2.

An inclination (angle) of the sidewall 111_S of the first isolation layer 111 may decrease from an area adjacent to the plurality of upper nanosheets UNW1 to an area adjacent to the plurality of lower nanosheets BNW1. The inclination of the sidewall 111_S of the first isolation layer 111 may be continuously decreased relative to the third direction DR3. For example, the inclination of the sidewall 111_S, with respect to the top face 111_T of the first isolation layer 111, may continuously decrease in the third direction DR3 when moving from the area adjacent to the plurality of upper nanosheets UNW1 to the area adjacent to the plurality of lower nanosheets BNW1. Conversely, the inclination of the sidewall 111_S of the first isolation layer 111, with respect to the top face 111_T of the first isolation layer 111, may continuously increase in the third direction DR3 when moving from the area adjacent to the plurality of lower nanosheets BNW1 to the area adjacent to the plurality of upper nanosheets UNW1. A profile of the sidewall 111_S of the first isolation layer 111 may have a curved shape. For example, the sidewall 111_S of the first isolation layer 111 may have a concave profile.

Referring to FIGS. 2 and 3, each of widths W1 and W2 of the first isolation layer 111 in the first direction DR1 and the second direction DR2, respectively, may be the smallest at the farthest vertical level from both the first plurality of lower nanosheets BNW1 and the first plurality of upper nanosheets UNW1. For example, each of the widths W1 and W2 of the first isolation layer 111 in the first direction DR1 and the second direction DR2, respectively, may be the smallest at a level in the third direction DR3 that is located between the first plurality of lower nanosheets BNW1 and the first plurality of upper nanosheets UNW1. For example, the level in the third direction DR3 may be located halfway between the first plurality of lower nanosheets BNW1 and the first plurality of upper nanosheets UNW1. However, the present disclosure is not limited thereto. Each of the widths W1 and W2 of the first isolation layer 111 in the first direction DR1 and the second direction DR2, respectively, may decrease in the third direction DR3 away from the first plurality of lower nanosheets BNW1 and the first plurality of upper nanosheets UNW1. For example, each of the widths W1 and W2 of the first isolation layer 111 in the first direction DR1 and the second direction DR2, respectively, may decrease when moving in the third direction DR3 toward a point located between the first plurality of lower nanosheets BNW1 and the first plurality of upper nanosheets UNW1. For example, the point may be located halfway between the first plurality of lower nanosheets BNW1 and the first plurality of upper nanosheets UNW1. However, the present disclosure is not limited thereto.

The second isolation layer 112 may be disposed between the second plurality of lower nanosheets BNW2 and the second plurality of upper nanosheets UNW2. The second isolation layer 112 may be spaced apart from the second plurality of lower nanosheets BNW2 and the second plurality of upper nanosheets UNW2 in the third direction DR3. The second isolation layer 112 may be spaced apart from the first isolation layer 111 in the first direction DR1.

In one example, the descriptions regarding the shape of the first isolation layer 111, the inclination of the sidewall 111_S of the first isolation layer 111, and each of the widths W1 and W2 of the first isolation layer 111 as described above may be equally applied to the second isolation layer 112.

Each of the first isolation layer 111 and the second isolation layer 112 may include, for example, at least one of silicon nitride (SiN), silicon oxycarbonitride (SiOCN), silicon boron carbonitride (SiBCN), silicon carbonitride (SiCN), silicon oxynitride (SiON) and/or combinations thereof. As used herein, the term "and/or" includes any and all combinations of one or more of the associated listed items.

The first gate electrode G1 may extend in the second direction DR2 and may be disposed on the active pattern F and the field insulating film 105. The first gate electrode G1 may surround each of the first plurality of lower nanosheets BNW1, the first isolation layer 111 and the first plurality of upper nanosheets UNW1. The second gate electrode G2 may extend in the second direction DR2 and may be disposed on the active pattern F and the field insulating film 105. The second gate electrode G2 may be spaced apart from the first gate electrode G1 in the first direction DR1. The second gate electrode G2 may surround each of the second plurality of lower nanosheets BNW2, the second isolation layer 112 and the second plurality of upper nanosheets UNW2.

Each of the first and second gate electrodes G1 and G2 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and/or combinations thereof. However, the present disclosure is not limited thereto. Each of the first and second gate electrodes G1 and G2 may include a conductive metal oxide, or a conductive metal oxynitride. Each of the conductive metal oxide and the conductive metal oxynitride may include oxidized products of the above-mentioned materials. The present disclosure is not limited thereto.

In FIGS. 2 and 3, each of the first plurality of lower nanosheets BNW1 and the first plurality of upper nanosheets UNW1 is illustrated as being surrounded with one gate electrode G1. However, the present disclosure is not limited thereto. Although not specifically shown, a gate isolation layer may divide the first gate electrode G1 into a lower gate electrode and an upper gate electrode thereof, and may divide the second gate electrode G2 into a lower gate electrode and an upper gate electrode thereof.

The lower source/drain region BSD may be disposed on the active pattern F and on at least one side of each of the first and second gate electrodes G1 and G2. For example, the lower source/drain region BSD may be disposed on the active pattern F and on both opposing sides of each of the first and second gate electrodes G1 and G2. The lower source/drain region BSD may be disposed on sidewalls of each of the first and second plurality of lower nanosheets BNW1 and BNW2. The lower source/drain region BSD may contact the sidewalls of each of the first and second plurality of lower nanosheets BNW1 and BNW2.

A vertical level of an upper surface of the lower source/drain region BSD may be higher than that of an upper surface of the uppermost nanosheet among the first plurality of lower nanosheets BNW1. The vertical level of the upper surface of the lower source/drain region BSD may be higher than that of an upper surface of the uppermost nanosheet among the second plurality of lower nanosheets BNW2. The vertical level of the upper surface of the lower source/drain region BSD may be lower than that of a bottom surface of each of the first isolation layer 111 and the second isolation layer 112. The lower source/drain region BSD may not be in contact with each of the first isolation layer 111 and the second isolation layer 112. However, the present disclosure is not limited thereto.

The first plurality of lower nanosheets BNW1 and portions of the first gate electrode G1 may be alternately stacked with each other to constitute a first lower structure BST1. The second plurality of lower nanosheets BNW2 and portions of the second gate electrode G2 may be alternately stacked with each other to constitute a second lower structure BST2. The first plurality of upper nanosheets UNW1 and portions of the first gate electrode G1 may be alternately stacked with each other to constitute a first upper structure UST1. The second plurality of upper nanosheets UNW2 and portions of the second gate electrode G2 may be alternately stacked with each other to constitute a second upper structure UST2.

Referring to FIG. 2, a height H1 of the first lower structure BST1 in the third direction DR3 may be larger than a height H2 of the first upper structure UST1 in the third direction DR3. Similarly, a height of the second lower structure BST2 in the third direction DR3 may be larger than a height of the second upper structure UST2 in the third direction DR3. As used herein, a height of the first lower structure BST1, the first upper structure UST1, the second lower structure BST2, and/or the second upper structure UST2 may also refer to a thickness of each of those respective structures.

The first interlayer insulating film 130 may cover the lower source/drain region BSD on the field insulating film 105. Although not shown, the first interlayer insulating film 130 may surround a portion of a lower sidewall of each of the first and second gate electrodes G1 and G2 on the field insulating film 105. Further, the first interlayer insulating film 130 may surround a portion of an upper sidewall of each of the first and second gate electrodes G1 and G2 on the field insulating film 105. The first interlayer insulating film 130 may contact both opposing sidewalls in the first direction DR1 of each of the first isolation layer 111 and the second isolation layer 112 on the lower source/drain region BSD.

The first interlayer insulating film 130 may include, for example, at least one of silicon oxide, silicon nitride, silicon oxynitride, and/or a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, the present disclosure is not limited thereto.

The upper source/drain region USD may be disposed on the first interlayer insulating film 130 and on at least one side of each of the first and second gate electrodes G1 and G2. For example, the upper source/drain region USD may be disposed on the first interlayer insulating film 130 and on both opposing sides of each of the first and second gate electrodes G1 and G2. The upper source/drain region USD may be disposed on sidewalls of each of the first and second plurality of upper nanosheets UNW1 and UNW2. The upper source/drain region USD may contact the sidewalls of each of the first and second plurality of upper nanosheets UNW1 and UNW2. The upper source/drain region USD may overlap with the lower source/drain region BSD in the third direction DR3.

A vertical level of an upper surface of the upper source/drain region USD may be higher than that of an upper surface of the uppermost nanosheet among the first plurality of upper nanosheets UNW1. The vertical level of the upper surface of the upper source/drain region USD may be higher than that of an upper surface of the uppermost nanosheet among the second plurality of upper nanosheets UNW2. However, the present disclosure is not limited thereto.

The upper source/drain region USD may not be in contact with each of the first isolation layer 111 and the second isolation layer 112. However, the present disclosure is not limited thereto.

The gate spacer 123 may be disposed on both opposing sidewalls of each of the first and second gate electrodes G1 and G2 on the active pattern F and may extend in the second direction DR2. The gate spacer 123 may be disposed on both opposing sidewalls of the first gate electrode G1 on the uppermost nanosheet of the first plurality of upper nanosheets UNW1. Further, the gate spacer 123 may be disposed on both opposing sidewalls of the second gate electrode G2 on the uppermost nanosheet of the second plurality of upper nanosheets UNW2. The gate spacer 123 may be disposed on the field insulating film 105 and on both opposing sidewalls of each of the first and second gate electrodes G1 and G2 and may extend in the second direction DR2.

The gate spacer 123 may include, for example, at least one of silicon nitride (SiN), silicon oxynitride (SiON), silicon carbonitride (SiCN), silicon oxycarbonitride (SiOCN), silicon boron nitride (SiBN), silicon oxyboron nitride (SiOBN), silicon oxycarbide (SiOC), and/or combinations thereof.

The gate insulating film 122 may be disposed between the first gate electrode G1 and the gate spacer 123, and between the second gate electrode G2 and the gate spacer 123. The gate insulating film 122 may be disposed between the first gate electrode G1 and the lower source/drain region BSD, and between the second gate electrode G2 and the lower source/drain region BSD. The gate insulating film 122 may be disposed between the first gate electrode G1 and the upper source/drain region USD, and between the second gate electrode G2 and the upper source/drain region USD. The gate insulating film 122 may be disposed between each of the first and second gate electrodes G1 and G2 and the active pattern F. The gate insulating film 122 may be disposed between each of the first and second gate electrodes G1 and G2 and the field insulating film 105.

Further, the gate insulating film 122 may be disposed between the first gate electrode G1 and the first plurality of lower nanosheets BNW1. The gate insulating film 122 may be disposed between the first gate electrode G1 and the first plurality of upper nanosheets UNW1. The gate insulating film 122 may be disposed between the second gate electrode G2 and the second plurality of lower nanosheets BNW2. The gate insulating film 122 may be disposed between the second gate electrode G2 and the second plurality of upper nanosheets UNW2.

Further, the gate insulating film 122 may be disposed between the first gate electrode G1 and the first isolation layer 111. The gate insulating film 122 may be disposed between the second gate electrode G2 and the second isolation layer 112.

The gate insulating film 122 may include at least one of silicon oxide, silicon oxynitride, silicon nitride, or a high dielectric constant material having a higher dielectric constant than that of silicon oxide. The high dielectric constant material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The semiconductor device according to some embodiments may include an NC (negative capacitance) FET using a negative capacitor. In one example, the gate insulating film 122 may include a ferroelectric material film having ferroelectric characteristics and a paraelectric material film having paraelectric characteristics.

The ferroelectric material film may have negative capacitance, and the paraelectric material film may have positive capacitance. For example, when two or more capacitors may be connected in series to each other, and a capacitance of each of the capacitors has a positive value, a total capacitance is less than the capacitance of each individual capacitor. On the contrary, when at least one of the capacitances of two or more capacitors connected in series to each other has a negative value, the total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and/or lead zirconium titanium oxide. In this connection, in one example, hafnium zirconium oxide may refer to a material obtained by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and/or tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and/or yttrium (Y).

When the dopant is aluminum (Al), the ferroelectric material film may contain about 3 to about 8 at. % (atomic %) of aluminum. In this connection, a content of the dopant may be a content of aluminum based on a sum of hafnium and aluminum.

When the dopant is silicon (Si), the ferroelectric material film may contain about 2 to about 10 at. % of silicon. When the dopant is yttrium (Y), the ferroelectric material film may contain about 2 to about 10 at. % of yttrium. When the dopant is gadolinium (Gd), the ferroelectric material film may contain about 1 to about 7 at. % of gadolinium. When the dopant is zirconium (Zr), the ferroelectric material film may contain about 50 to about 80 at. % of zirconium.

The paraelectric material film may have paraelectric properties. The paraelectric material film may include, for example, at least one of silicon oxide and/or metal oxide having a high dielectric constant. The metal oxide contained in the paraelectric material film may include, for example, at least one of hafnium oxide, zirconium oxide and/or aluminum oxide. However, the present disclosure is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film may be different from a crystal structure of hafnium oxide contained in the paraelectric material film.

The ferroelectric material film may have a thickness sized to exhibit ferroelectric properties. The thickness of the ferroelectric material film may be, for example, in a range of about 0.5 to about 10 nm. However, the present disclosure is not limited thereto. Because a critical thickness exhibiting the ferroelectric properties may vary based on a type of the ferroelectric material, the thickness of the ferroelectric material film may vary depending on the type of the ferroelectric material.

In one example, the gate insulating film 122 may include one ferroelectric material film. In another example, the gate insulating film 122 may include a plurality of ferroelectric material films spaced apart from each other. The gate insulating film 122 may have a stack structure in which a plurality of ferroelectric material films and a plurality of paraelectric material films are alternately stacked with each other.

The capping pattern 124 may be disposed on the first gate electrode G1, the second gate electrode G2, the gate insulating film 122 and the gate spacer 123 and extend in the second direction DR2. For example, the capping pattern 124 may be in contact with an upper surface of the gate spacer 123. However, the present disclosure is not limited thereto. In some other embodiments, the capping pattern 124 may be disposed between the gate spacers 123. In this case, an upper surface of the capping pattern 124 may be coplanar with the upper surface of the gate spacer 123. The capping pattern 124 may include, for example, at least one of silicon nitride (SiN), silicon oxynitride (SiON), silicon oxide ($SiO_2$), silicon carbonitride (SiCN), silicon oxycarbonitride (SiOCN), and/or combinations thereof.

The second interlayer insulating film 140 may cover the upper source/drain region USD on the first interlayer insulating film 130. Although not shown, the second interlayer insulating film 140 may surround a portion of a sidewall of each of the first and second gate electrodes G1 and G2 on the field insulating film 105.

For example, an upper surface of the second interlayer insulating film 140 may be coplanar with the upper surface of the capping pattern 124. However, the present disclosure is not limited thereto. In some other embodiments, the second interlayer insulating film 140 may cover the upper surface of the capping pattern 124. For example, the second interlayer insulating film 140 may include the same material as that of the first interlayer insulating film 130. The second interlayer insulating film 140 may include, for example, at least one of silicon oxide, silicon nitride, silicon oxynitride, and/or a low dielectric constant material.

The source/drain contact CA may extend through the second interlayer insulating film 140 in the third direction DR3 and be electrically connected to the upper source/drain region USD. At least a portion of the source/drain contact CA may extend into the upper source/drain region USD. For example, an upper surface of the source/drain contact CA may be coplanar with the upper surface of the second interlayer insulating film 140. However, the present disclosure is not limited thereto. Although it is shown in FIG. 2 that the source/drain contact CA is formed as a single film, this is for convenience of illustration, and the present disclosure is not limited thereto. For example, the source/drain contact CA may be formed as a multilayer film. The source/drain contact CA may include a conductive material.

The silicide layer 150 may be disposed between the upper source/drain region USD and the source/drain contact CA. The silicide layer 150 may include, for example, a metal silicide material.

The first gate contact CB1 may be disposed on the first gate electrode G1. The first gate contact CB1 may extend through the capping pattern 124 in the third direction DR3 and may be electrically connected to the first gate electrode G1. The second gate contact CB2 may be disposed on the second gate electrode G2. The second gate contact CB2 may extend through the capping pattern 124 in the third direction DR3 and may be electrically connected to the second gate electrode G2.

For example, an upper surface of each of the first and second gate contacts CB1 and CB2 may be coplanar with the upper surface of the second interlayer insulating film 140. However, the present disclosure is not limited thereto. In FIGS. 2 and 3, each of the first and second gate contacts CB1 and CB2 is shown to be formed as a single film, but this is for convenience of illustration, and the present disclosure is not limited thereto. For example, each of the first and second gate contacts CB1 and CB2 may be formed as a multilayer contact (e.g., a multilayer film). Each of the first and second gate contacts CB1 and CB2 may include a conductive material.

The etch stop film 160 may be disposed on an upper surface of each of the second interlayer insulating film 140 and the capping pattern 124. The etch stop film 160 may be, for example, conformally formed thereon. Although FIGS. 2 and 3 show that the etch stop film 160 is formed as a single film, the present disclosure is not limited thereto. In some other embodiments, the etch stop film 160 may be formed as a multilayer film. The etch stop film 160 may include, for example, at least one of aluminum oxide, aluminum nitride, hafnium oxide, zirconium oxide, silicon oxide, silicon nitride, silicon oxynitride and/or a low dielectric constant material.

The third interlayer insulating film 170 may be disposed on the etch stop film 160. The third interlayer insulating film 170 may include, for example, at least one of silicon oxide, silicon nitride, silicon oxynitride, and/or a low dielectric constant material.

The first via V1 may extend through the third interlayer insulating film 170 and the etch stop film 160 in the third direction DR3 and may be electrically connected to the first gate contact CB1. The second via V2 may extend through the third interlayer insulating film 170 and the etch stop film 160 in the third direction DR3 and may be electrically connected to the second gate contact CB2. The third via V3 may extend through the third interlayer insulating film 170 and the etch stop film 160 in the third direction DR3 and may be electrically connected to the source/drain contact CA. In FIGS. 2 and 3, each of the first to third vias V1, V2, and V3 is shown to be formed as a single film. However, this is for convenience of illustration, and the present disclosure is not limited thereto. For example, each of the first to third vias V1, V2, and V3 may be formed as a multilayer via (e.g., a multilayer film). Each of the first to third vias V1, V2, and V3 may include a conductive material.

In the semiconductor device according to some embodiments of the present disclosure having the structure in which the plurality of upper nanosheets UNW1 and UNW2 are stacked on the plurality of lower nanosheets BNW1 and BNW2, the shape of each of the isolation layers 111 and 112 may be concave. For example, the width of a central portion of each of the isolation layers 111 and 112 may be smaller compared to that of a bottom and a top portion of each of the isolation layers 111 and 112. As a result, a short-channel effect (SCE) of the semiconductor device may be reduced such that reliability of the semiconductor device may be improved.

Figure 5:
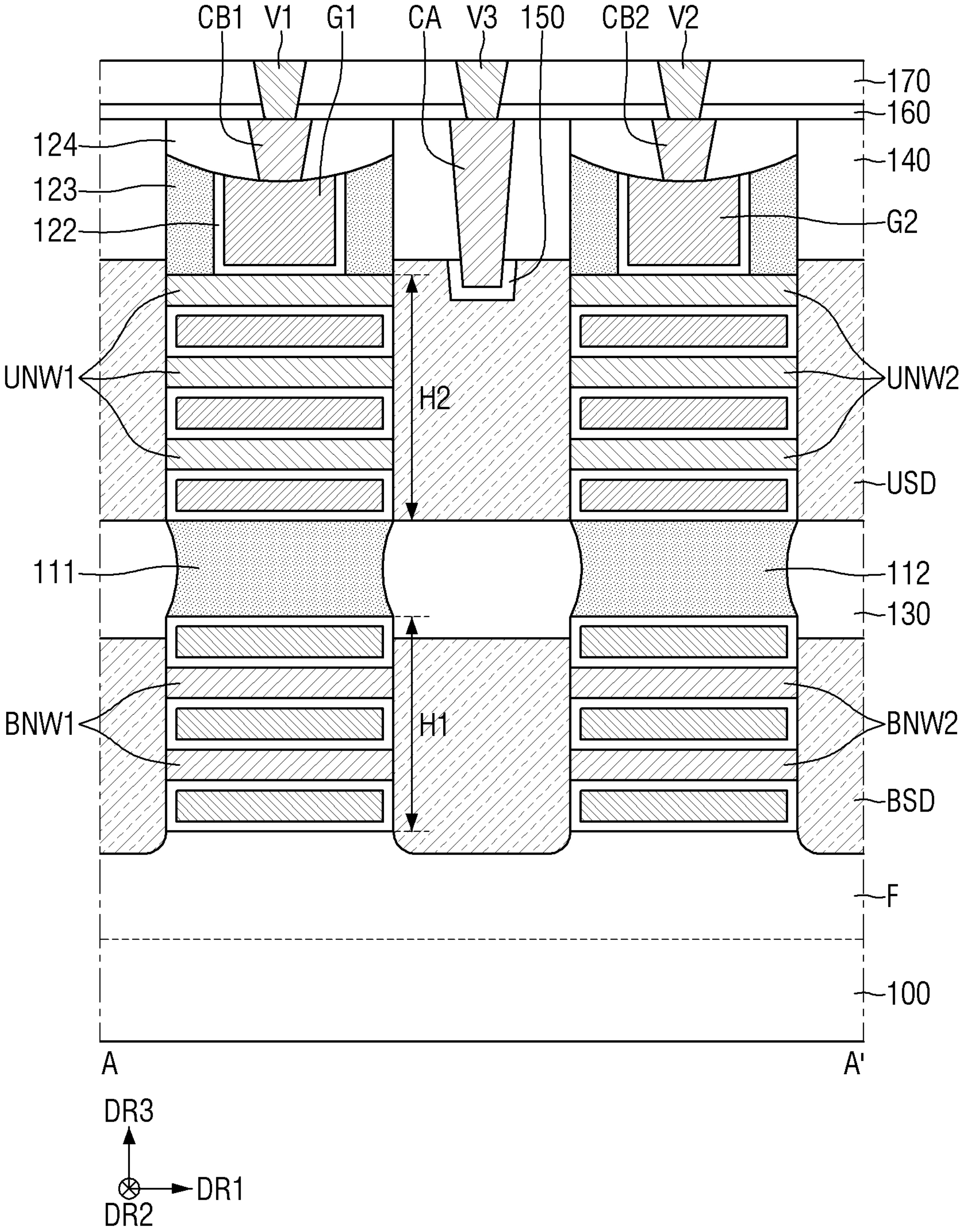
FIG. 5 is a cross-section diagram for illustrating a semiconductor device according to some embodiments of the present disclosure.
Figure 6:
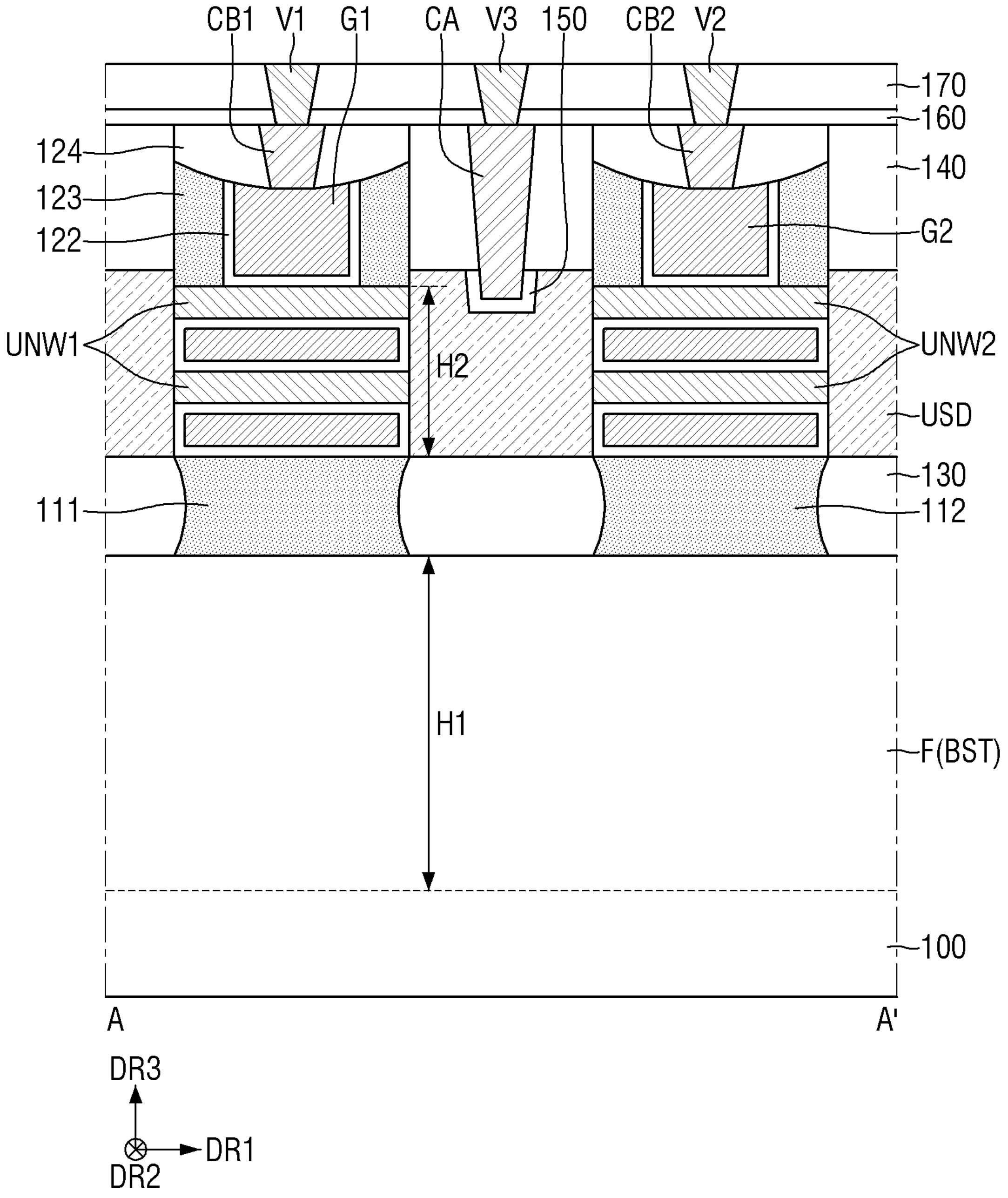
FIG. 6 is a cross-section diagram for illustrating a semiconductor device according to some embodiments of the present disclosure.
Figure 7:
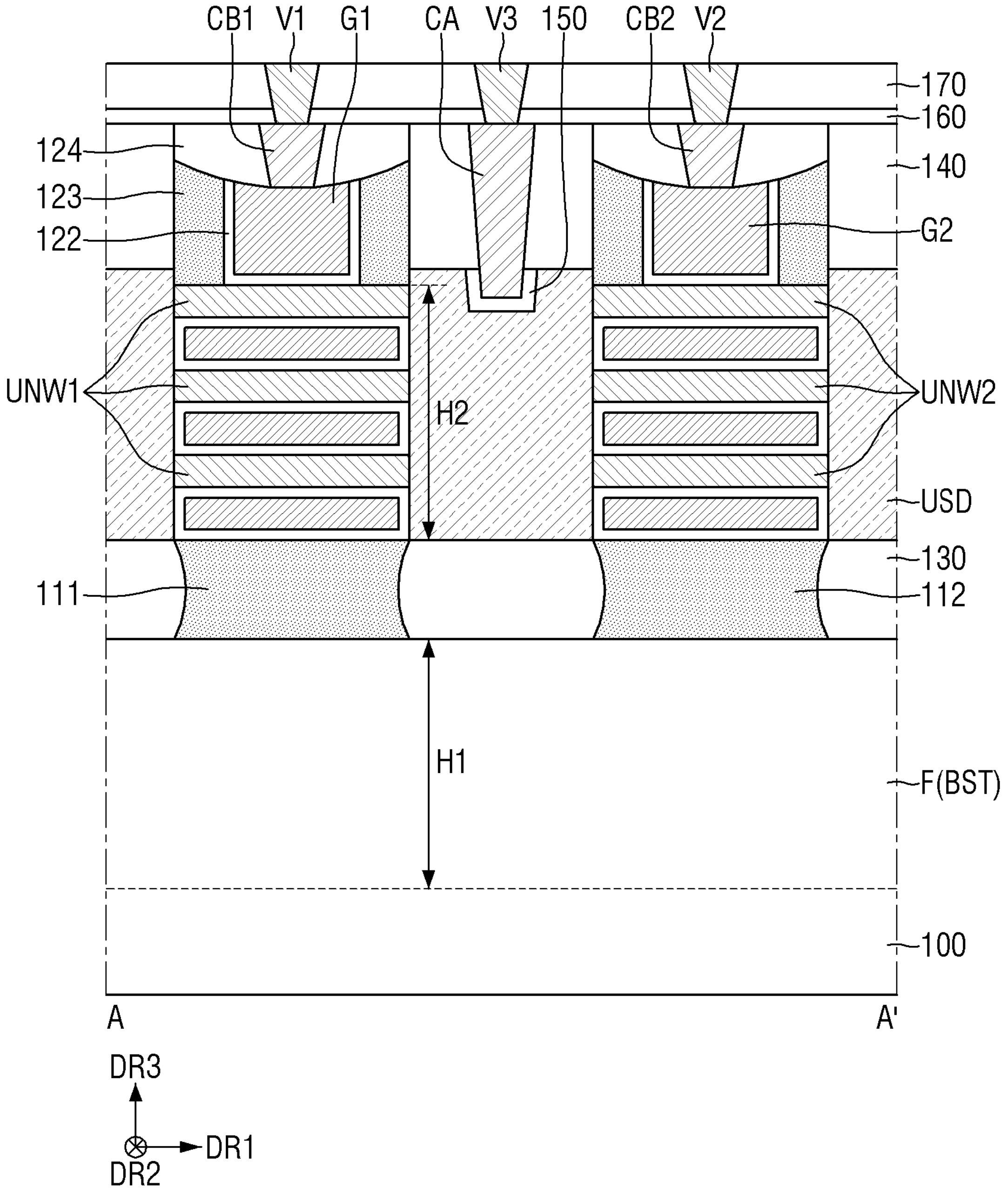
FIG. 7 is a cross-section diagram for illustrating a semiconductor device according to some embodiments of the present disclosure.

FIG. 5 corresponds to FIG. 2 and is a cross-section diagram for illustrating a semiconductor device according to some embodiments of the present disclosure. FIG. 6 corresponds to FIG. 2 and is a cross-section diagram for illustrating a semiconductor device according to some embodiments of the present disclosure. FIG. 7 corresponds to FIG. 2 and is a cross-section diagram for illustrating a semiconductor device according to some embodiments of the present disclosure. For convenience of description, the descriptions of the contents that are duplicated with the contents as described above with reference to FIGS. 1 to 4 may be omitted.

Referring to FIG. 5, the height H1 of the first lower structure (BST1 in FIG. 2) in the third direction DR3 may be smaller than the height H2 of the first upper structure (UST1 in FIG. 2) in the third direction DR3. The height of the second lower structure (BST2 in FIG. 2) in the third direction DR3 may also be smaller than the height of the second upper structure (UST2 in FIG. 2) in the third direction DR3.

For example, each of the first plurality of lower nanosheets BNW1 and the second plurality of lower nanosheets BNW2 may include two nanosheets stacked in the third direction DR3, while each of the first plurality of upper nanosheets UNW1 and the second plurality of upper nanosheets UNW2 may include three nanosheets stacked in the third direction DR3. However, the present disclosure is not limited thereto.

Referring to FIG. 6, the lower source/drain region BSD may not be formed, and the upper source/drain region USD may be formed on the active pattern F.

The upper source/drain region USD may be disposed on the active pattern F and on at least one side of each of the first and second gate electrodes G1 and G2. The upper source/drain region USD may be disposed on the active pattern F and on sidewalls of each of the first and second plurality of upper nanosheets UNW1 and UNW2.

The upper source/drain region USD may not contact each of the first isolation layer 111 and the second isolation layer 112. The first interlayer insulating film 130 may be interposed between the upper source/drain region USD and the active pattern F. However, the present disclosure is not limited thereto, and the first interlayer insulating film 130 and another insulating material layer may be interposed between the upper source/drain region USD and the active pattern F.

Further, the active pattern F may constitute the lower structure BST. The first plurality of upper nanosheets UNW1 and portions of the first gate electrode G1 may be alternately stacked with each other to constitute the first upper structure (UST1 in FIG. 2). The second plurality of upper nanosheets UNW2 and portions of the second gate electrode G2 may be alternately stacked with each other to constitute the second upper structure (UST2 in FIG. 2).

The height H1 of the lower structure BST in the third direction DR3 may be larger than the height H2 of the first upper structure (UST1 in FIG. 2) in the third direction DR3. The height H1 of the lower structure BST in the third direction DR3 may be larger than the height of the second upper structure (UST2 in FIG. 2) in the third direction DR3. As used herein, a height of the lower structure BST may also refer to a thickness of the lower structure BST.

Referring to FIG. 7, unlike FIG. 6, the height H1 of the lower structure BST in the third direction DR3 may be smaller than the height H2 of the first upper structure (UST1 in FIG. 2) in the third direction DR3. The height H1 of the lower structure BST in the third direction DR3 may be smaller than the height of the second upper structure (UST2 in FIG. 2) in the third direction DR3.

Figure 8:
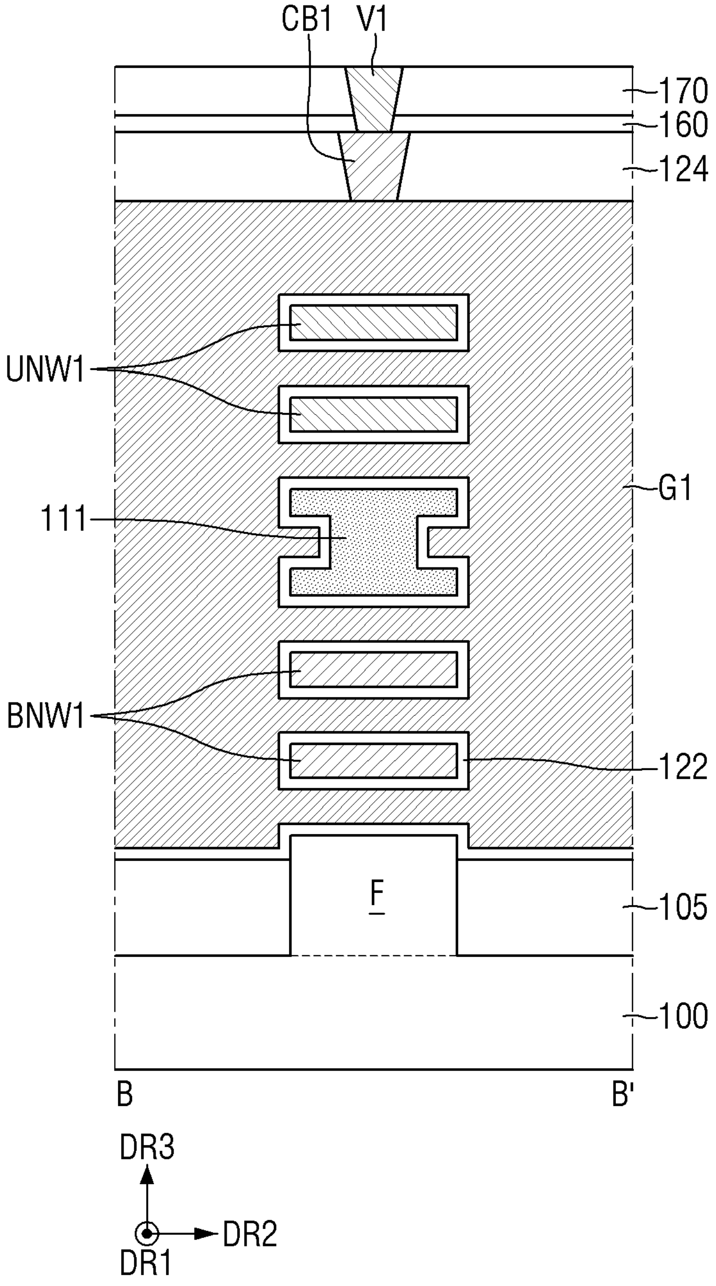
FIG. 8 is a cross-section diagram for illustrating a semiconductor device according to some embodiments of the present disclosure.

FIG. 8 corresponds to FIG. 3 and is a cross-section diagram for illustrating a semiconductor device according to some embodiments of the present disclosure. For convenience of description, the descriptions of the contents that are duplicated with the contents as described above with reference to FIGS. 1 to 4 may be omitted.

Referring to FIG. 8, a width of the first isolation layer 111 in the second direction DR2 may be the largest in each of an area adjacent to the first plurality of lower nanosheets BNW1 and an area adjacent to the first plurality of upper nanosheets UNW1. The width of the first isolation layer 111 in the second direction DR2 may be the smallest in an area spaced by the largest spacing from the first plurality of lower nanosheets BNW1 and the first plurality of upper nanosheets UNW1. For example, the width of the first isolation layer 111 in the second direction DR2 may be the smallest in an area in the third direction DR3 that is located halfway between the first plurality of lower nanosheets BNW1 and the first plurality of upper nanosheets UNW1.

The first isolation layer 111 may have an I-shape. In this case, unlike what is shown in FIG. 3, the first isolation layer 111 may not include a curved portion.

The descriptions regarding the shape of the first isolation layer 111 as described above may be equally applied to that of the second isolation layer 112.

Figure 9:
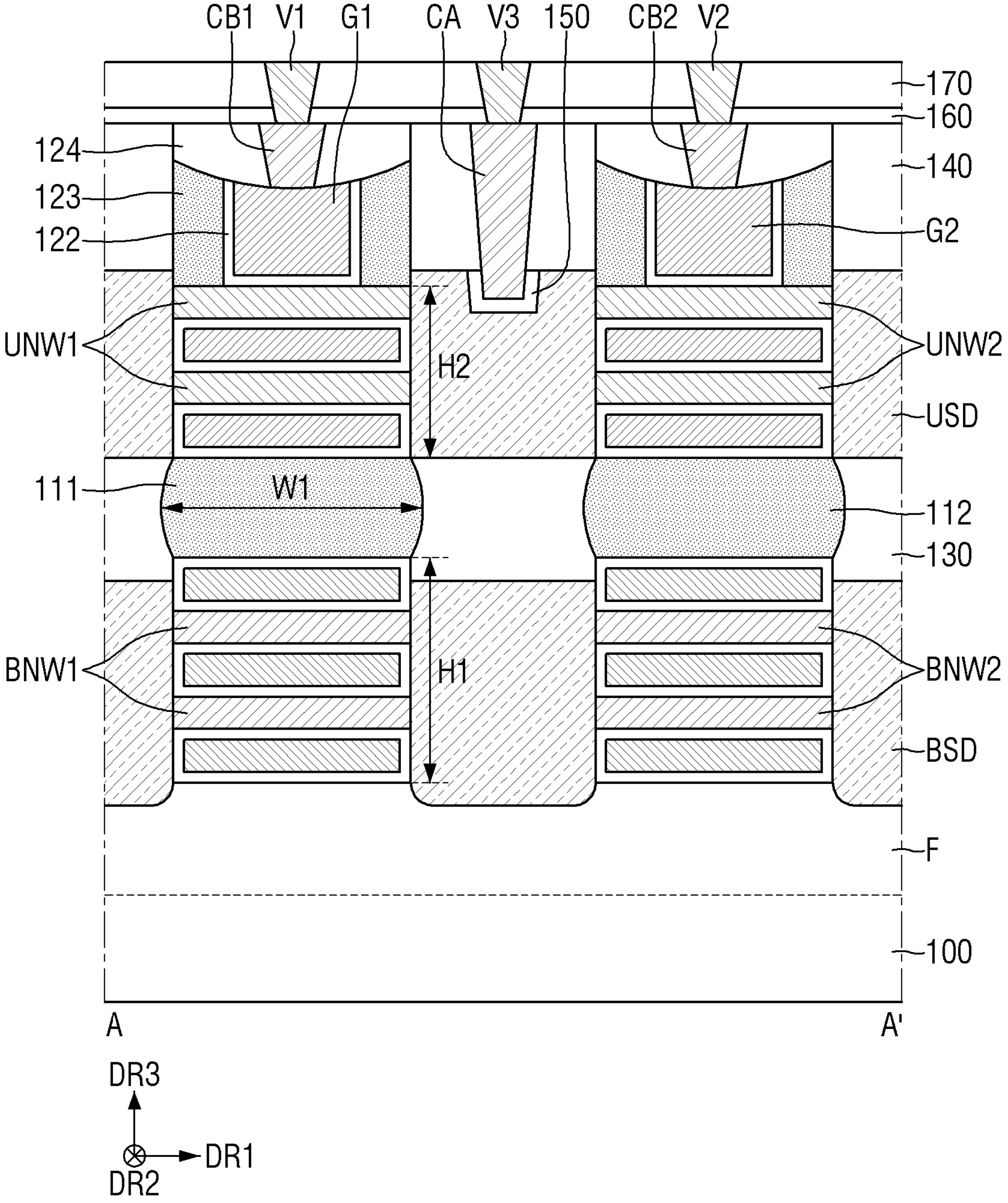
FIG. 9 is a cross-section diagram for illustrating a semiconductor device according to some embodiments of the present disclosure.
Figure 10:
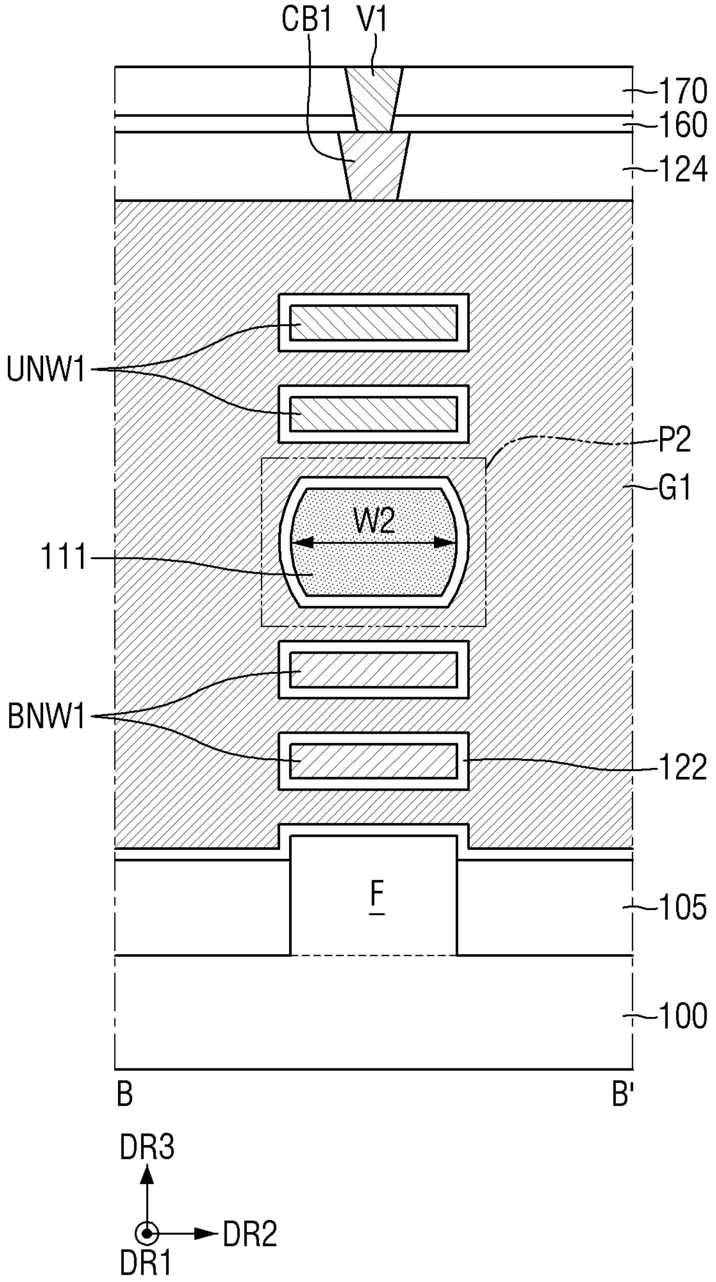
FIG. 10 is a cross-section diagram for illustrating a semiconductor device according to some embodiments of the present disclosure.
Figure 11:
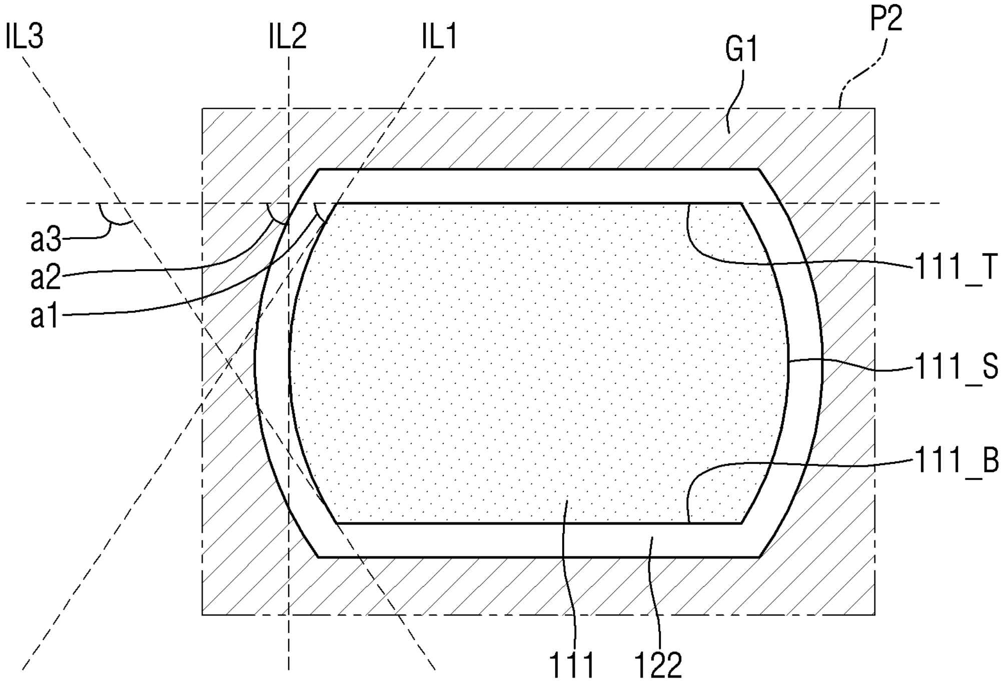
FIG. 11 is an enlarged view of an area P2 of FIG. 10.

FIG. 9 corresponds to FIG. 2 and is a cross-section diagram for illustrating a semiconductor device according to some embodiments of the present disclosure. FIG. 10 corresponds to FIG. 3 and is a cross-section diagram for illustrating a semiconductor device according to some embodiments of the present disclosure. FIG. 11 is an enlarged view of an area P2 of FIG. 10. For convenience of description, the descriptions of the contents that are duplicated with the contents as described above with reference to FIGS. 1 to 8 may be omitted.

Referring to FIG. 9, a profile of each of opposing sidewalls of the first isolation layer 111 may have a convex shape. Each sidewall of the first isolation layer 111 may protrude outwardly of the first isolation layer 111.

Referring to FIGS. 10 and 11, the first isolation layer 111 may have a bottom face 111_B closest to the first plurality of lower nanosheets BNW1, a top face 111_T closest to the first plurality of upper nanosheets UNW1 and opposite to the bottom face 111_B, and a sidewall 111_S connecting the bottom face 111_B and the top face 111_T to each other.

Imaginary lines IL1, IL2, and IL3 related to the sidewall 111_S of the first isolation layer 111 are assumed. An angle a2 in the counterclockwise direction defined between the top face 111_T of the first isolation layer 111 and the second imaginary line IL2 may be greater than an angle a1 in the counterclockwise direction defined between the top face 111_T of the first isolation layer 111 and the first imaginary line IL1. An angle a3 in the counterclockwise direction defined between the top face 111_T of the first isolation layer 111 and the third imaginary line IL3 may be greater than the angle a2 in the counterclockwise direction defined between the top face 111_T of the first isolation layer 111 and the second imaginary line IL2.

An inclination (angle) of the sidewall 111_S of the first isolation layer 111 may increase from an area adjacent to the plurality of upper nanosheets UNW1 to an area adjacent to the plurality of lower nanosheets BNW1. The inclination of the sidewall 111_S of the first isolation layer 111 may be continuously increased relative to the third direction DR3. For example, the inclination of the sidewall 111_S of the first isolation layer 111, with respect to the top face 111_T of the first isolation layer 111, may continuously increase in the third direction DR3 when moving from the area adjacent to the plurality of upper nanosheets UNW1 to the area adjacent to the plurality of lower nanosheets BNW1. Conversely, the inclination of the sidewall 111_S of the first isolation layer 111, with respect to the top face 111_T of the first isolation layer 111, may continuously decrease in the third direction DR3 when moving from the area adjacent to the plurality of lower nanosheets BNW1 to the area adjacent to the plurality of upper nanosheets UNW1. A profile of the sidewall 111_S of the first isolation layer 111 may have a curved shape. For example, the sidewall 111_S of the first isolation layer 111 may have a convex profile.

Referring to FIGS. 9 and 10, each of widths W1 and W2 of the first isolation layer 111 in the first direction DR1 and the second direction DR2, respectively, may be the largest at a vertical level farthest from both the first plurality of lower nanosheets BNW1 and the first plurality of upper nanosheets UNW1. For example, each of the widths W1 and W2 of the first isolation layer 111 in the first direction DR1 and the second direction DR2, respectively, may be the largest at a level in the third direction DR3 that is located between the first plurality of lower nanosheets BNW1 and the first plurality of upper nanosheets UNW1. For example, the level in the third direction DR3 may be located halfway between the first plurality of lower nanosheets BNW1 and the first plurality of upper nanosheets UNW1. However, the present disclosure is not limited thereto. Each of the widths W1 and W2 of the first isolation layer 111 in the first direction DR1 and the second direction DR2, respectively, may increase in the third direction DR3 away from each of the first plurality of lower nanosheets BNW1 and the first plurality of upper nanosheets UNW1. For example, each of the widths W1 and W2 of the first isolation layer 111 in the first direction DR1 and the second direction DR2, respectively, may increase when moving in the third direction DR3 toward a point located between the first plurality of lower nanosheets BNW1 and the first plurality of upper nanosheets UNW1. For example, the point may be located halfway between the first plurality of lower nanosheets BNW1 and the first plurality of upper nanosheets UNW1. However, the present disclosure is not limited thereto.

In one example, the descriptions regarding the shape of the first isolation layer 111, the inclination of the sidewall 111_S of the first isolation layer 111, and each of the widths W1 and W2 of the first isolation layer 111 as described above may be equally applied to the second isolation layer 112.

In the semiconductor device according to some embodiments of the present disclosure having a structure in which the plurality of upper nanosheets UNW1 and UNW2 are stacked on the plurality of lower nanosheets BNW1 and BNW2, the shape of each of the isolation layers 111 and 112 may be convex. For example, a width of the central portion of each of the isolation layers 111 and 112 may be the largest. As a result, parasitic capacitance between the gate electrode and the fin structure may be lowered such that the reliability of the semiconductor device may be improved.

Referring to FIG. 9, a height H1 along the third direction DR3 of the first lower structure (BST1 in FIG. 2) may be larger than a height H2 along the third direction DR3 of the first upper structure (UST1 in FIG. 2). A height along the third direction DR3 of the second lower structure (BST2 in FIG. 2) may be larger than a height along the third direction DR3 of the second upper structure (UST2 in FIG. 2).

Figure 12:
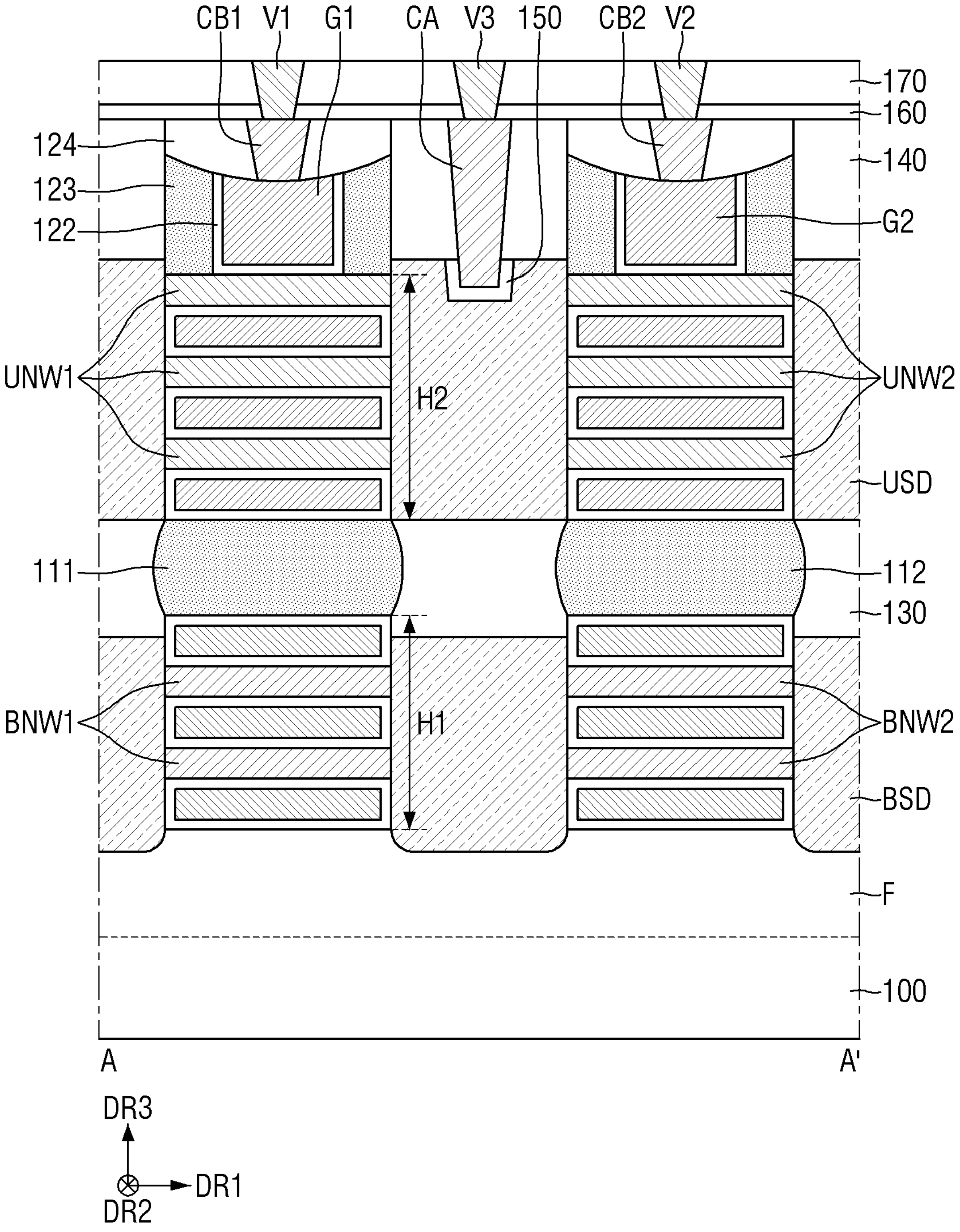
FIG. 12 is a cross-section diagram for illustrating a semiconductor device according to some embodiments of the present disclosure.

Referring to FIG. 12, a height H1 of the first lower structure (BST1 in FIG. 2) in the third direction DR3 may be smaller than a height H2 of the first upper structure (UST1 in FIG. 2) in the third direction DR3. A height of the second lower structure (BST2 in FIG. 2) in the third direction DR3 may be smaller than a height of the second upper structure (UST2 in FIG. 2) in the third direction DR3.

Figure 13:
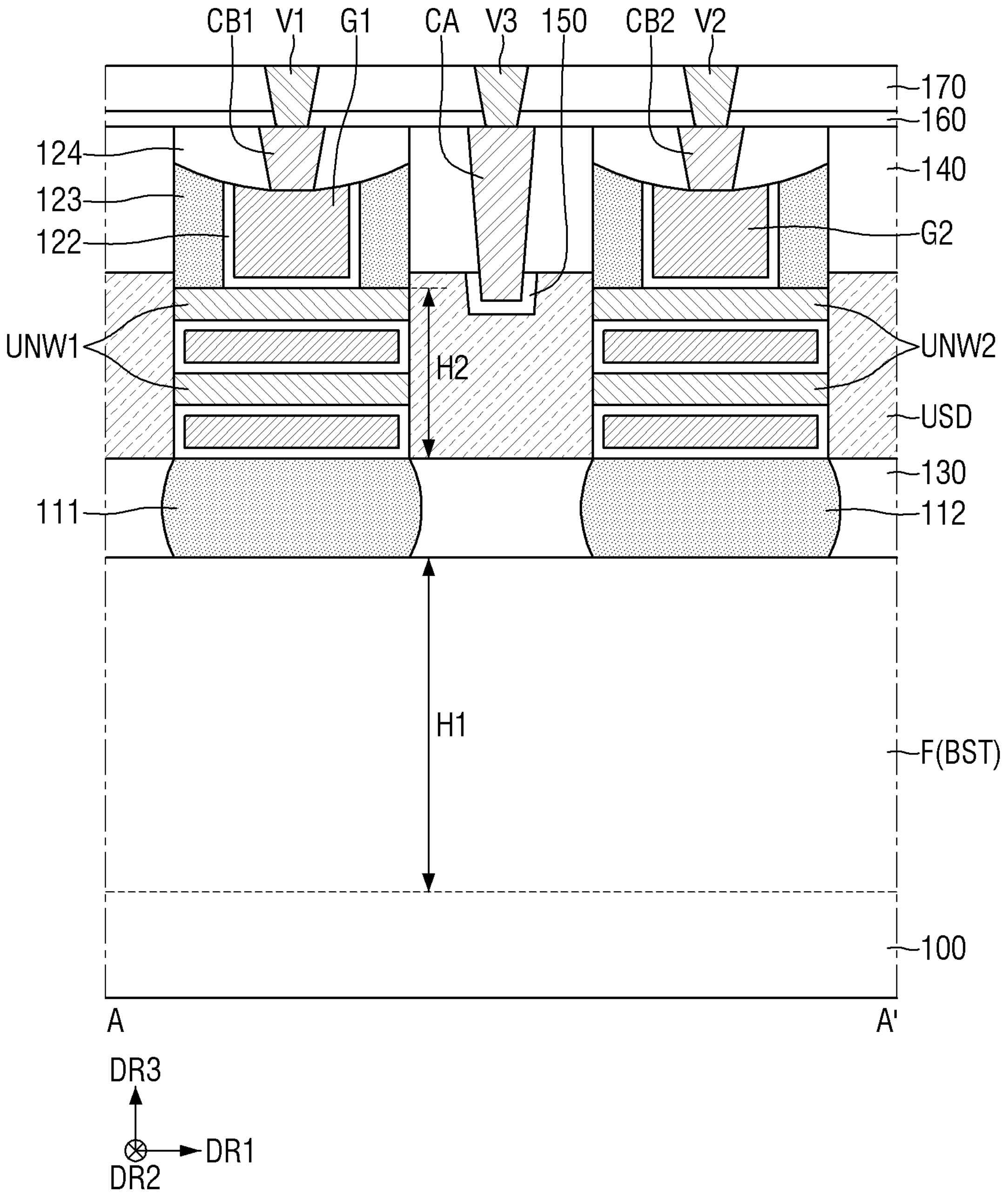
FIG. 13 is a cross-section diagram for illustrating a semiconductor device according to some embodiments of the present disclosure.

Referring to FIG. 13, the lower source/drain region BSD may not be formed, and the upper source/drain region USD may be formed on the active pattern F.

A height H1 of the lower structure BST in the third direction DR3 may be larger than a height H2 of the first upper structure (UST1 in FIG. 2) in the third direction DR3. The height H1 of the lower structure BST in the third direction DR3 may be larger than a height of the second upper structure (UST2 in FIG. 2) in the third direction DR3.

Figure 14:
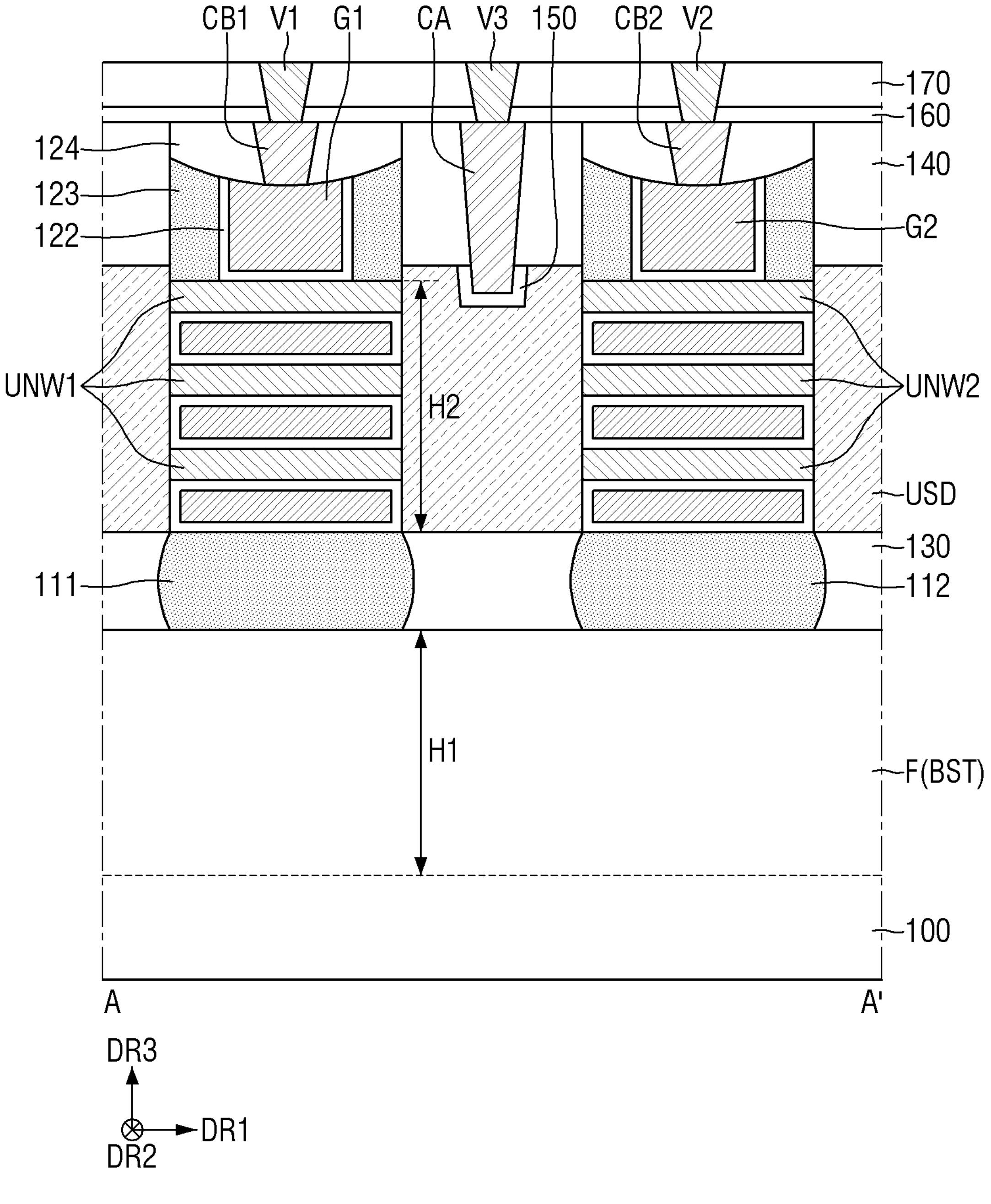
FIG. 14 is a cross-section diagram for illustrating a semiconductor device according to some embodiments of the present disclosure.

Referring to FIG. 14, unlike FIG. 13, the height H1 of the lower structure BST in the third direction DR3 may be smaller than the height H2 of the first upper structure (UST1 in FIG. 2) in the third direction DR3. The height H1 of the lower structure BST in the third direction DR3 may be smaller than the height of the second upper structure (UST2 in FIG. 2) in the third direction DR3.

Figure 15:
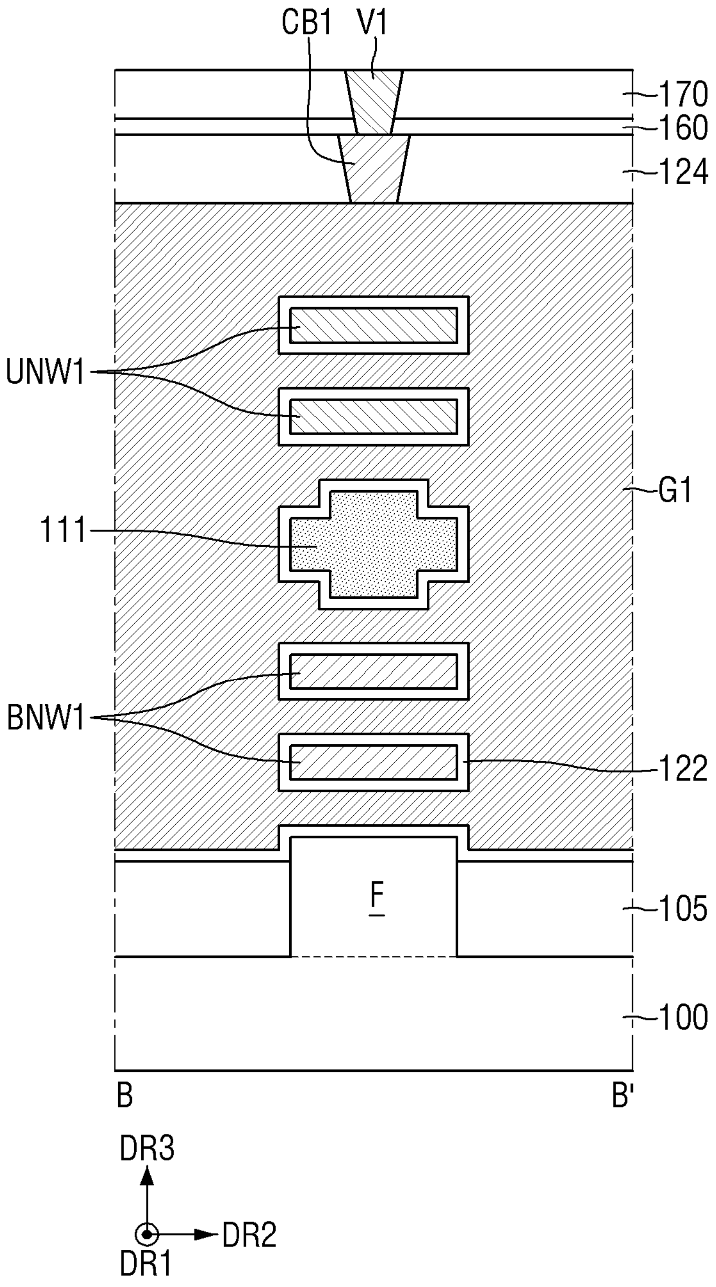
FIG. 15 is a cross-section diagram for illustrating a semiconductor device according to some embodiments of the present disclosure.

Referring to FIG. 15, a width of the first isolation layer 111 in the second direction DR2 may be the smallest at each of an area adjacent to the first plurality of lower nanosheets BNW1 and an area adjacent to the first plurality of upper nanosheets UNW1. The width of the first isolation layer 111 in the second direction DR2 may be the largest at an area spaced, by the largest spacing, from both the first plurality of lower nanosheets BNW1 and the first plurality of upper nanosheets UNW1. For example, the width of the isolation layer 111 in the second direction DR2 may be the largest at an area in the third direction DR3 that is located halfway between the first plurality of lower nanosheets BNW1 and the first plurality of upper nanosheets UNW1.

The first isolation layer 111 may have a shape of a cross. In this case, unlike what is shown in FIG. 9, the first isolation layer 111 may not include a curved portion.

In one example, the description regarding the shape of the first isolation layer 111 as set forth above may be equally applied to that of the second isolation layer 112.

Hereinafter, a method for manufacturing a semiconductor device according to some embodiments of the present disclosure will be described with reference to FIGS. 16 to 34.

FIGS. 16 to 34 are diagrams of intermediate structures of steps for illustrating a method of manufacturing a semiconductor device according to some embodiments of the present disclosure.

Figure 16:
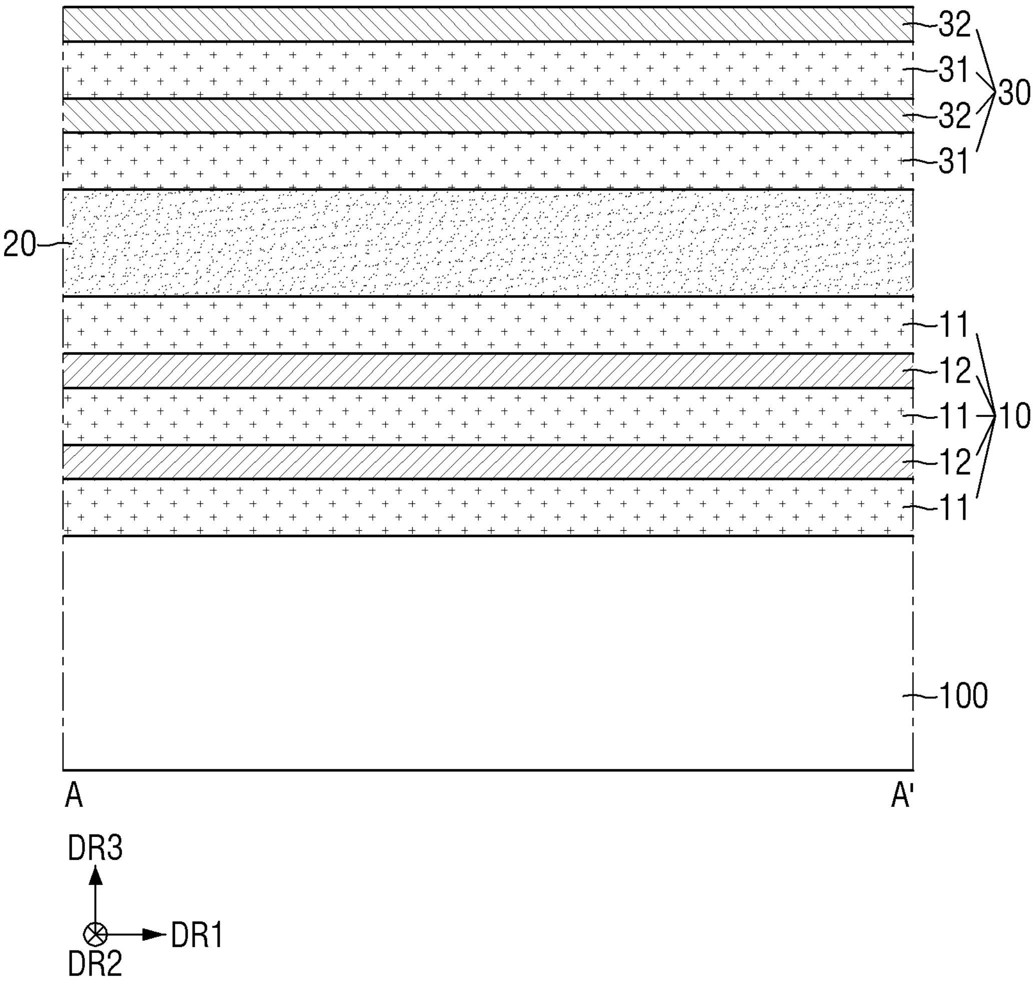
FIGS. 16 to 34 are diagrams of intermediate structures of steps for illustrating a method of manufacturing a semiconductor device according to some embodiments of the present disclosure.
Figure 17:
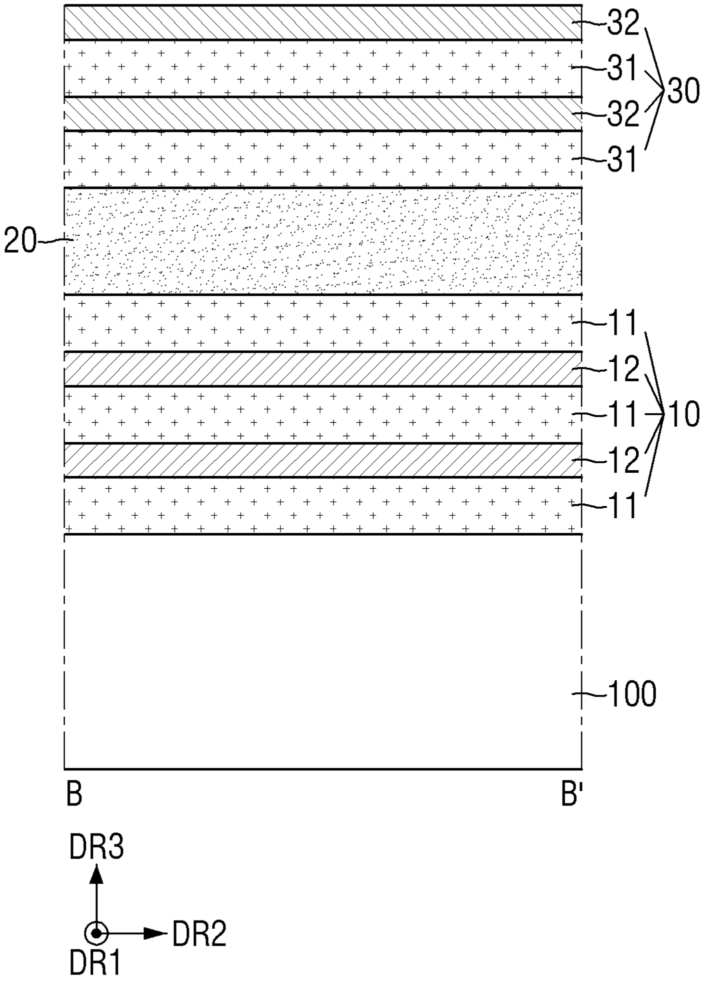

Referring to FIGS. 16 and 17, a first stack structure 10, a second sacrificial layer 20 and a third stack structure 30 may be sequentially stacked on the substrate 100. The first stack structure 10 may include first sacrificial layers 11 and first semiconductor layers 12 alternately stacked with each other on the substrate 100. For example, the first sacrificial layer 11 may be formed on a lowermost portion of the first stack structure 10, while the first semiconductor layer 12 may be formed on an uppermost portion of the first stack structure 10. For example, the first sacrificial layer 11 may be formed on the substrate 100, the first semiconductor layer 12 may be formed on the first sacrificial layer 11, and remaining first sacrificial layers 11 and first semiconductor layers 12 may be alternately stacked thereon. However, the present disclosure is not limited thereto. In some other embodiments, the first sacrificial layer 11 may be formed on the uppermost portion of the first stack structure 10. The first sacrificial layer 11 may include, for example, silicon germanium (SiGe). The first semiconductor layer 12 may include, for example, silicon (Si).

Subsequently, the second sacrificial layer 20 may be stacked on the first stack structure 10. A thickness in the third direction DR3 of the second sacrificial layer 20 may be greater than a thickness in the third direction DR3 of the first sacrificial layer 11. The second sacrificial layer 20 may include, for example, silicon germanium (SiGe). For example, a concentration of germanium (Ge) included in the second sacrificial layer 20 may be greater than a concentration of germanium (Ge) included in the first sacrificial layer 11.

The third stack structure 30 may include third sacrificial layers 31 and second semiconductor layers 32 alternately stacked with each other on the second sacrificial layer 20. For example, the third sacrificial layer 31 may formed on a lowermost portion of the third stack structure 30, while the second semiconductor layer 32 may be formed on an uppermost portion of the third stack structure 30. For example, the third sacrificial layer 31 may be formed on the second sacrificial layer 20, the second semiconductor layer 32 may be formed on the third sacrificial layer 31, and remaining third sacrificial layers 31 and second semiconductor layers 32 may be alternately stacked thereon. However, the present disclosure is not limited thereto. In some other embodiments, the third sacrificial layer 31 may also be formed on the uppermost portion of the third stack structure 30. The third sacrificial layer 31 may include, for example, silicon germanium (SiGe). For example, a concentration of germanium (Ge) included in the third sacrificial layer 31 may be smaller than a concentration of germanium (Ge) included in the second sacrificial layer 20. The second semiconductor layer 32 may include, for example, silicon (Si).

Figure 18:
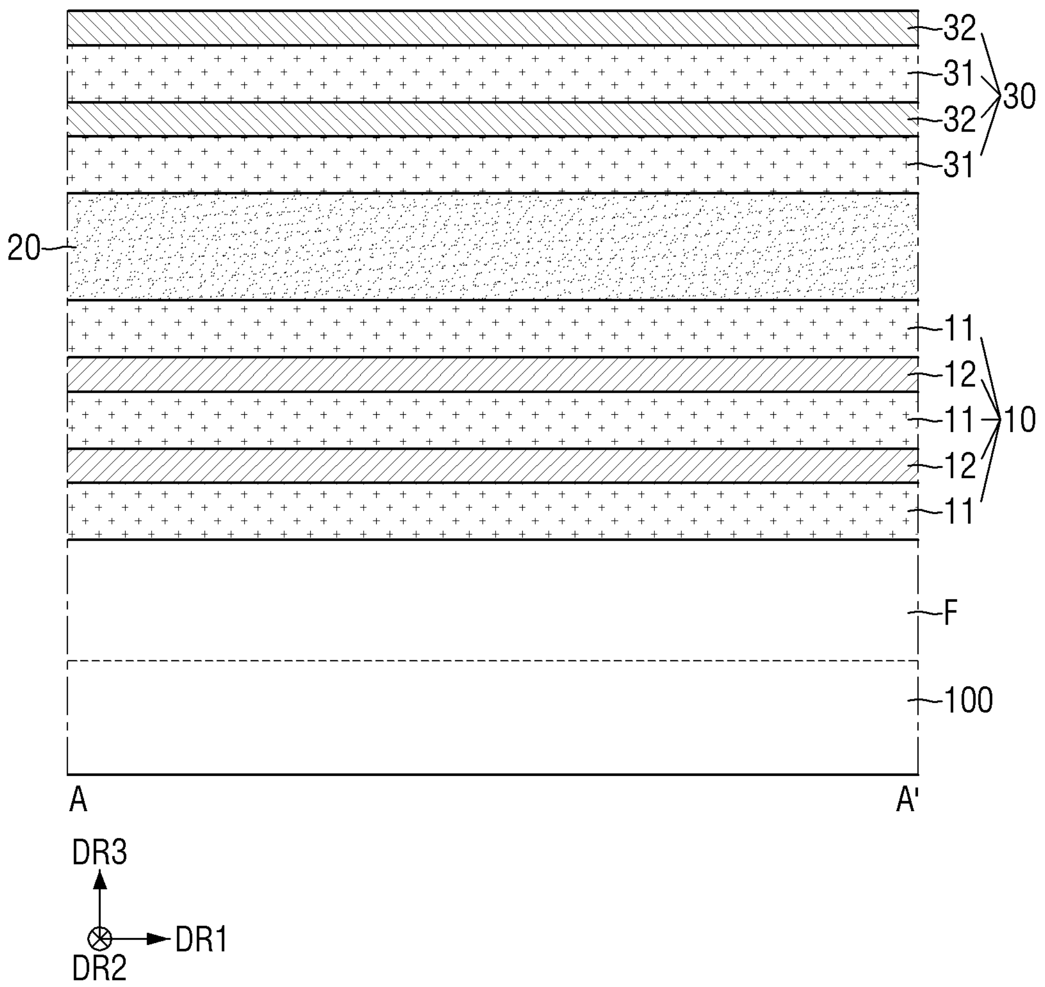
Figure 19:
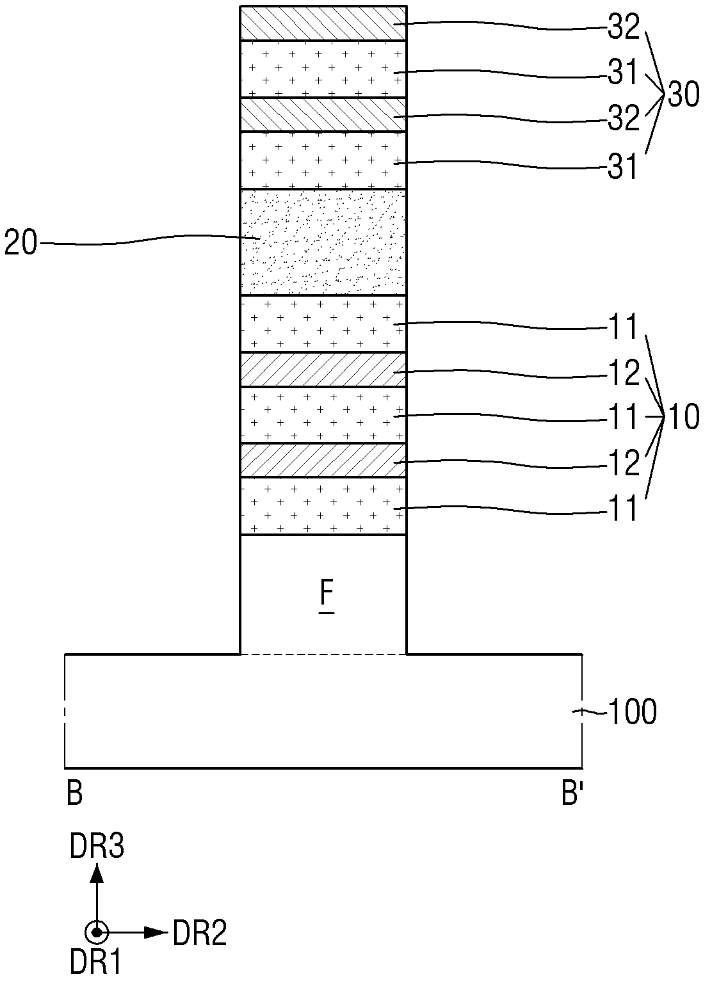

Referring to FIGS. 18 and 19, the active pattern F may be formed on the substrate 100 by etching a portion of each of the first stack structure 10, the second sacrificial layer 20, the third stack structure 30 and the substrate 100. The active pattern F may extend in the first direction DR1. The active pattern F may protrude from the substrate 100 in the third direction DR3.

Figure 20:
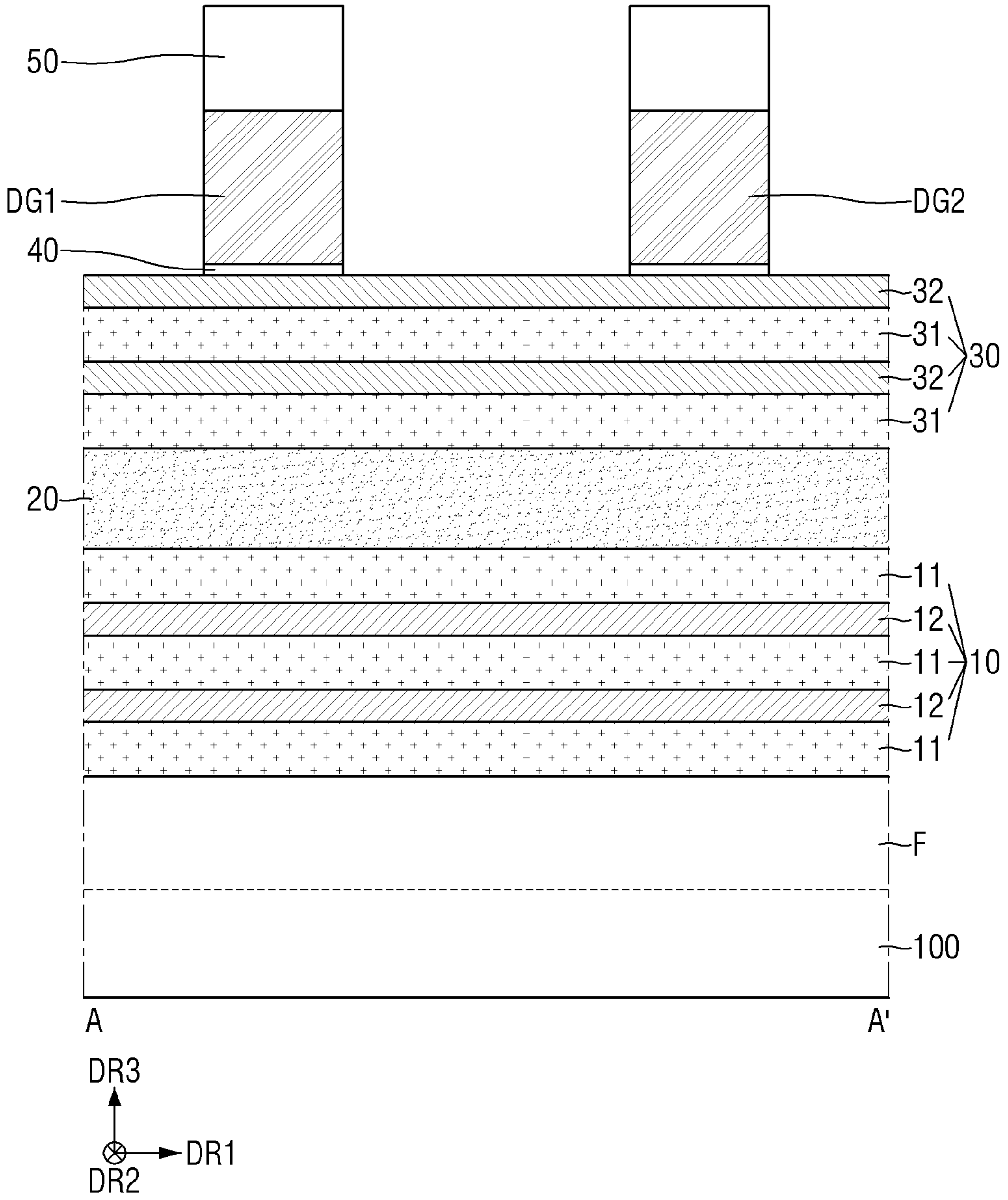
Figure 21:
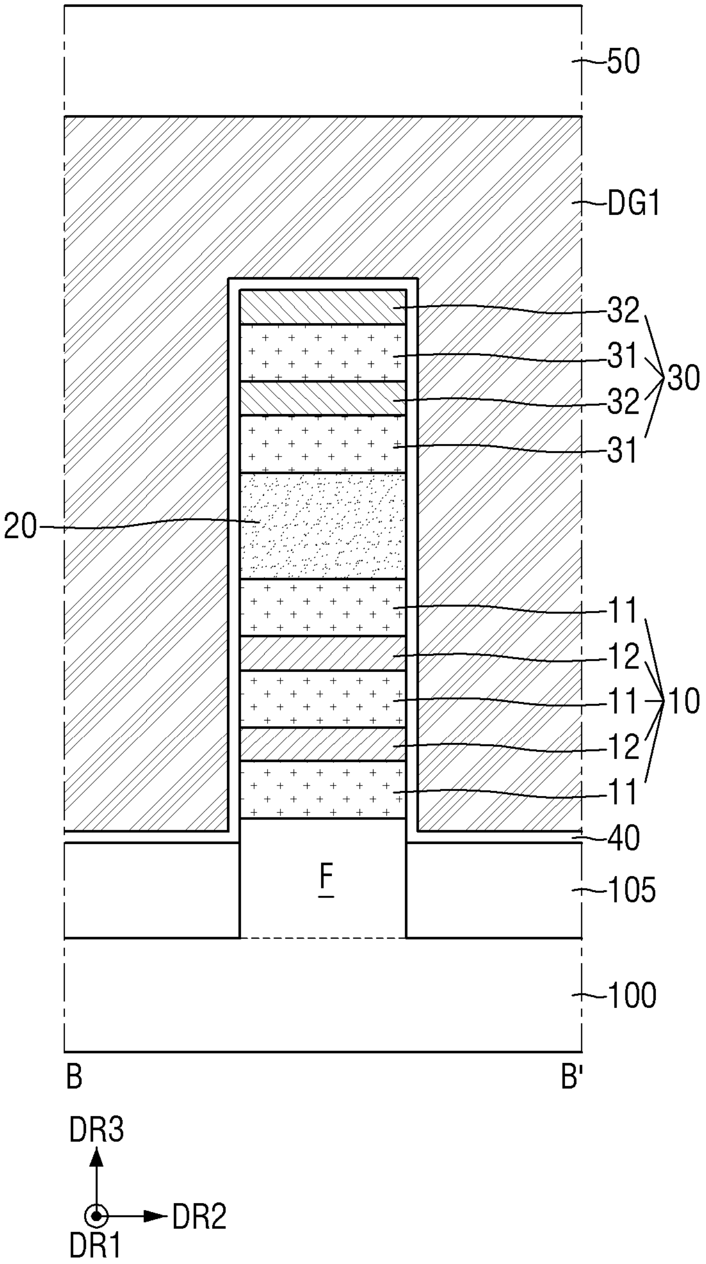

Referring to FIGS. 20 and 21, the field insulating film 105 surrounding the sidewall of the active pattern F may subsequently be formed on the substrate 100. For example, the active pattern F may protrude in the third direction DR3 beyond the upper surface of the field insulating film 105.

A pad oxide film 40 may be formed to cover each of the field insulating film 105, the first stack structure 10, the second sacrificial layer 20, and the third stack structure 30. For example, the pad oxide film 40 may be conformally formed thereon. The pad oxide film 40 may include, for example, silicon oxide ($SiO_2$).

First and second dummy gates DG1 and DG2 may be formed on the pad oxide film 40 on the first stack structure 10, the second sacrificial layer 20, and the third stack structure 30. Each of the first and second dummy gates DG1 and DG2 may extend in the second direction DR2. The second dummy gate DG2 may be spaced apart from the first dummy gate DG1 in the first direction DR1. Further, a dummy capping pattern 50 may be formed on each of the first and second dummy gates DG1 and DG2.

For example, a remaining portion of the pad oxide film 40 may be removed except for a portion thereof overlapping each of the first and second dummy gates DG1 and DG2 in the third direction DR3.

Figure 22:
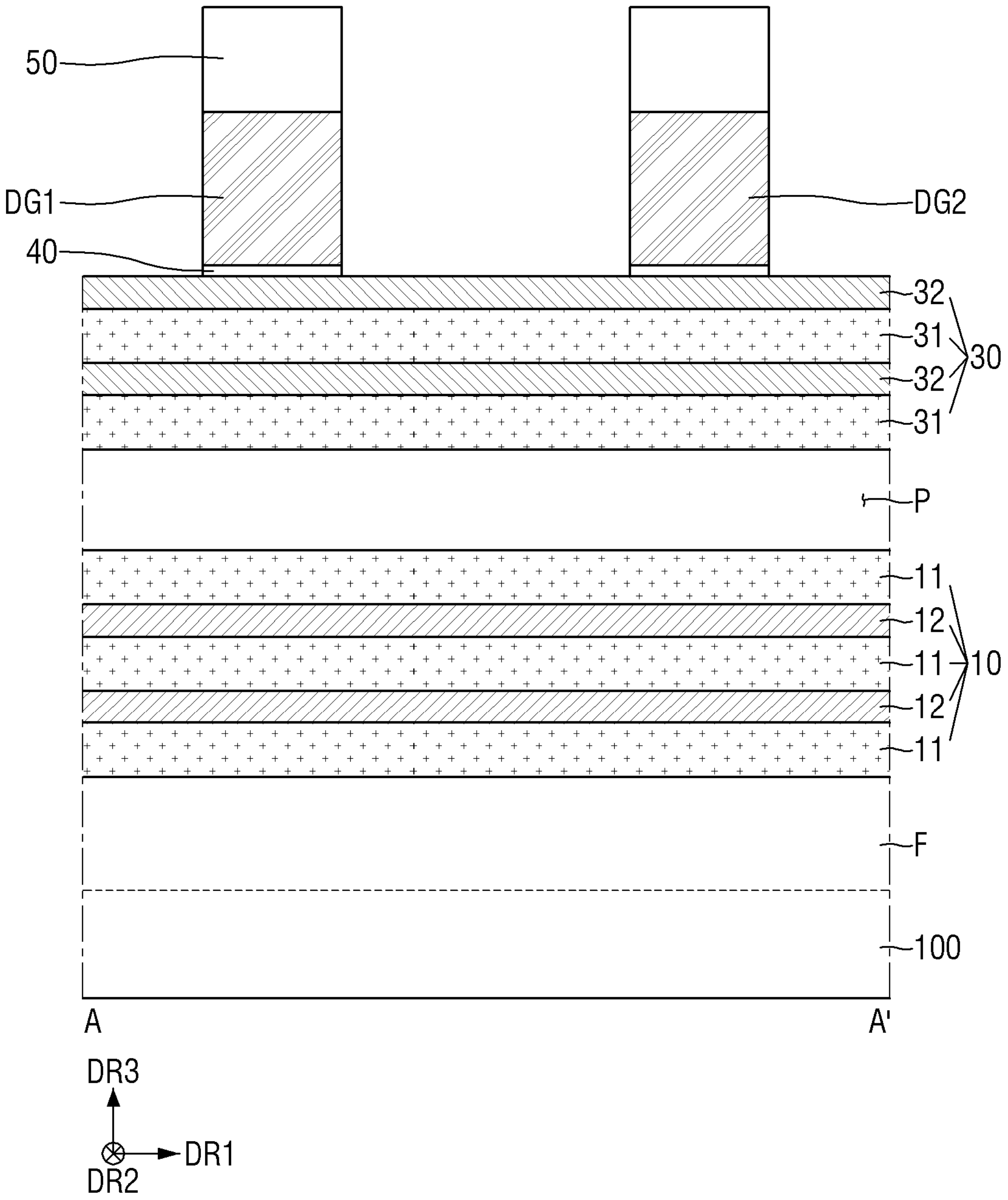
Figure 23:
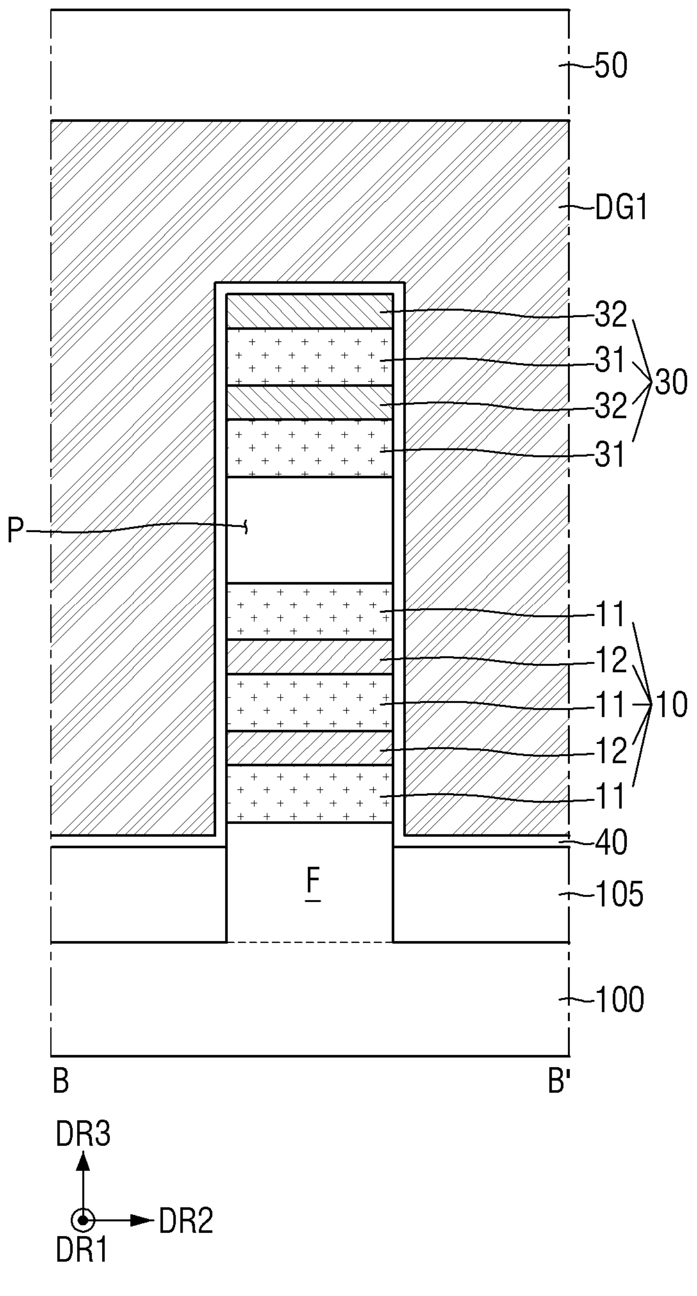

Referring to FIGS. 22 and 23, the second sacrificial layer 20 may be removed. The second sacrificial layer 20 may be removed using a wet etching process. The second sacrificial layer 20 may be removed to form an empty space P.

Figure 24:
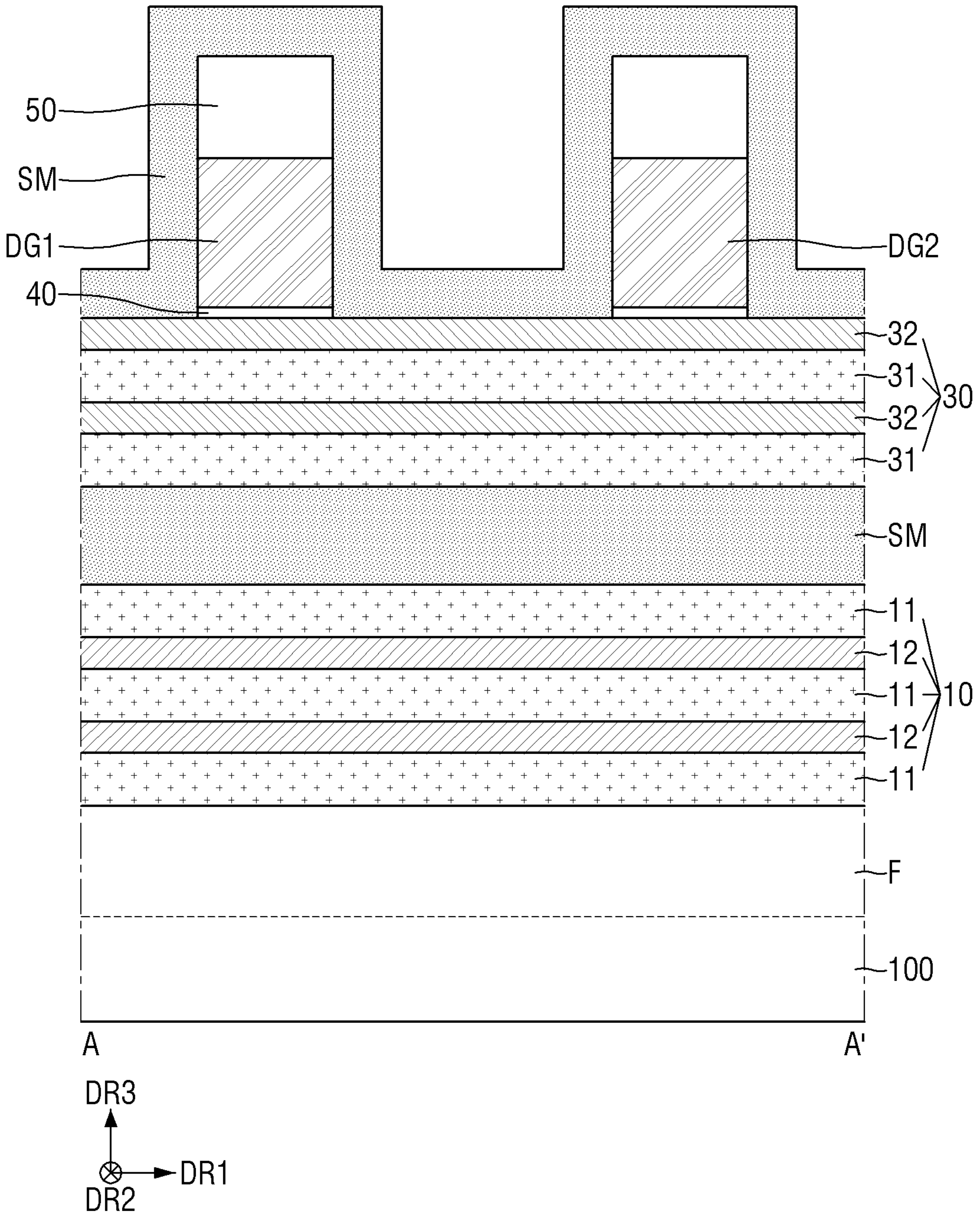
Figure 25:
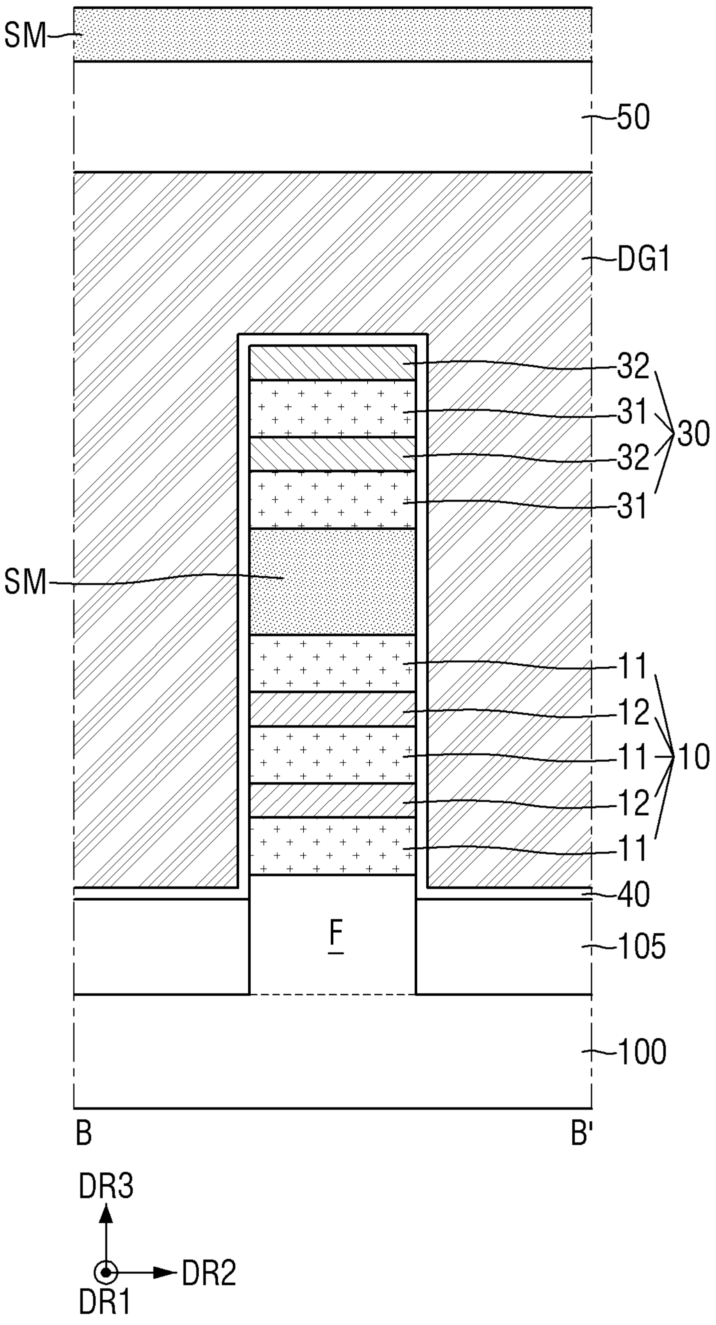

Referring to FIGS. 24 and 25, a spacer material layer SM may be formed to cover a sidewall of each of the first and second dummy gates DG1 and DG2, and a sidewall and an upper surface of the dummy capping pattern 50. Although not shown, the spacer material layer SM may also be formed on an exposed upper surface of the field insulating film 105, a sidewall of the first stack structure 10, and a sidewall and an upper surface of the third stack structure 30. Further, the spacer material layer SM may fill the area P where the second sacrificial layer (20 in FIGS. 20 and 21) has been removed. For example, the spacer material layer SM may be conformally formed thereon. The spacer material layer SM may include, for example, at least one of silicon nitride (SiN), silicon oxycarbonitride (SiOCN), silicon boron carbonitride (SiBCN), silicon carbonitride (SiCN), silicon oxynitride (SiON), and/or combinations thereof.

Figure 26:
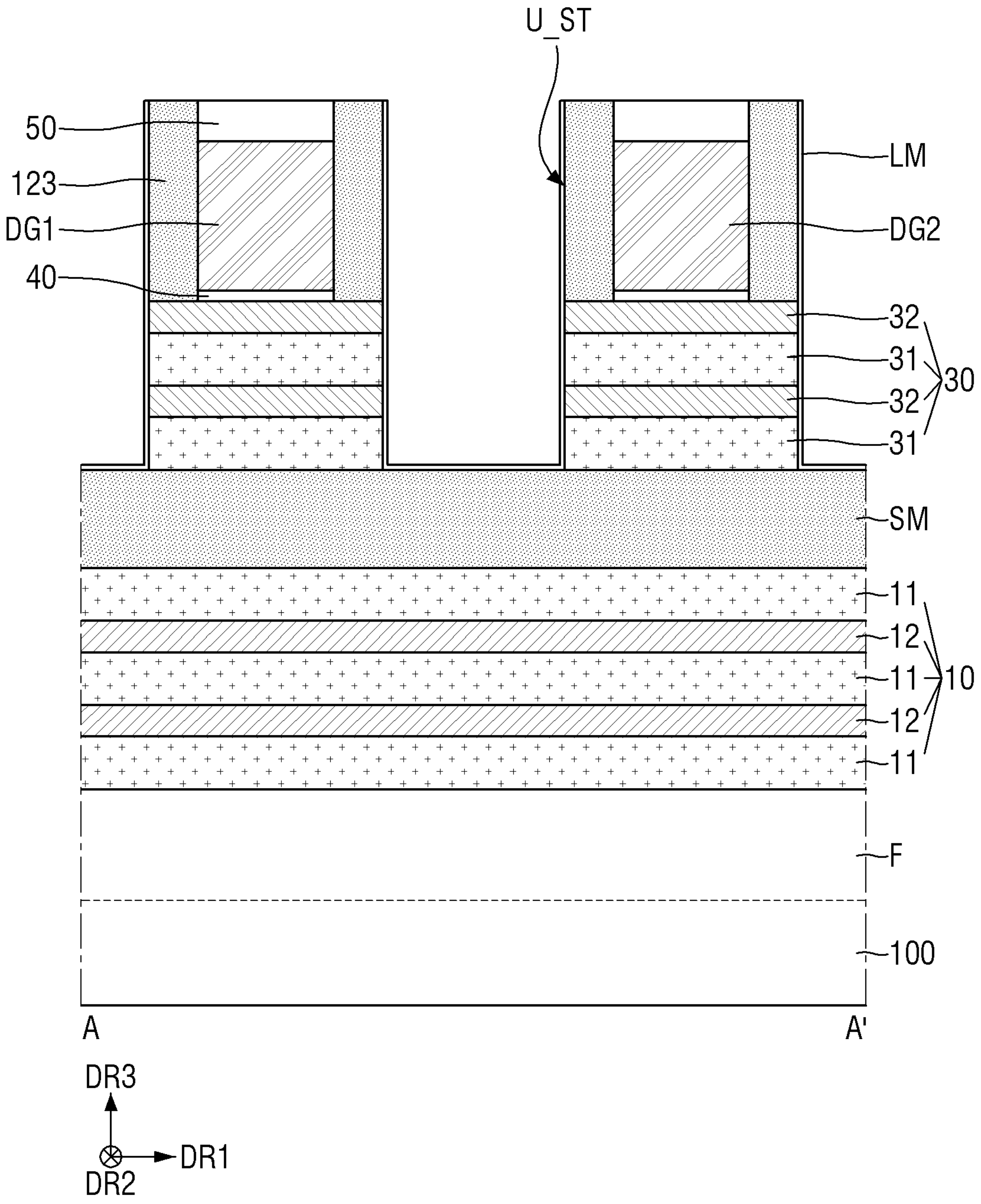

Referring to FIG. 26, an upper source/drain trench U_ST may be formed by etching at least a portion of the third stack structure 30 using the dummy capping pattern 50 and the first and second dummy gates DG1 and DG2 as a mask.

For example, the upper source/drain trench U_ST may extend toward the active pattern F. That is, the upper source/drain trench U_ST may be formed on the active pattern F and between the first dummy gate DG1 and the second dummy gate DG2.

Thereafter, a liner material layer LM may be formed in the upper source/drain trench U_ST. The liner material layer LM may be conformally formed along and on a sidewall and a bottom surface of the upper source/drain trench U_ST. The liner material layer LM may be formed on at least a portion of an upper surface of the spacer material layer SM.

Figure 27:
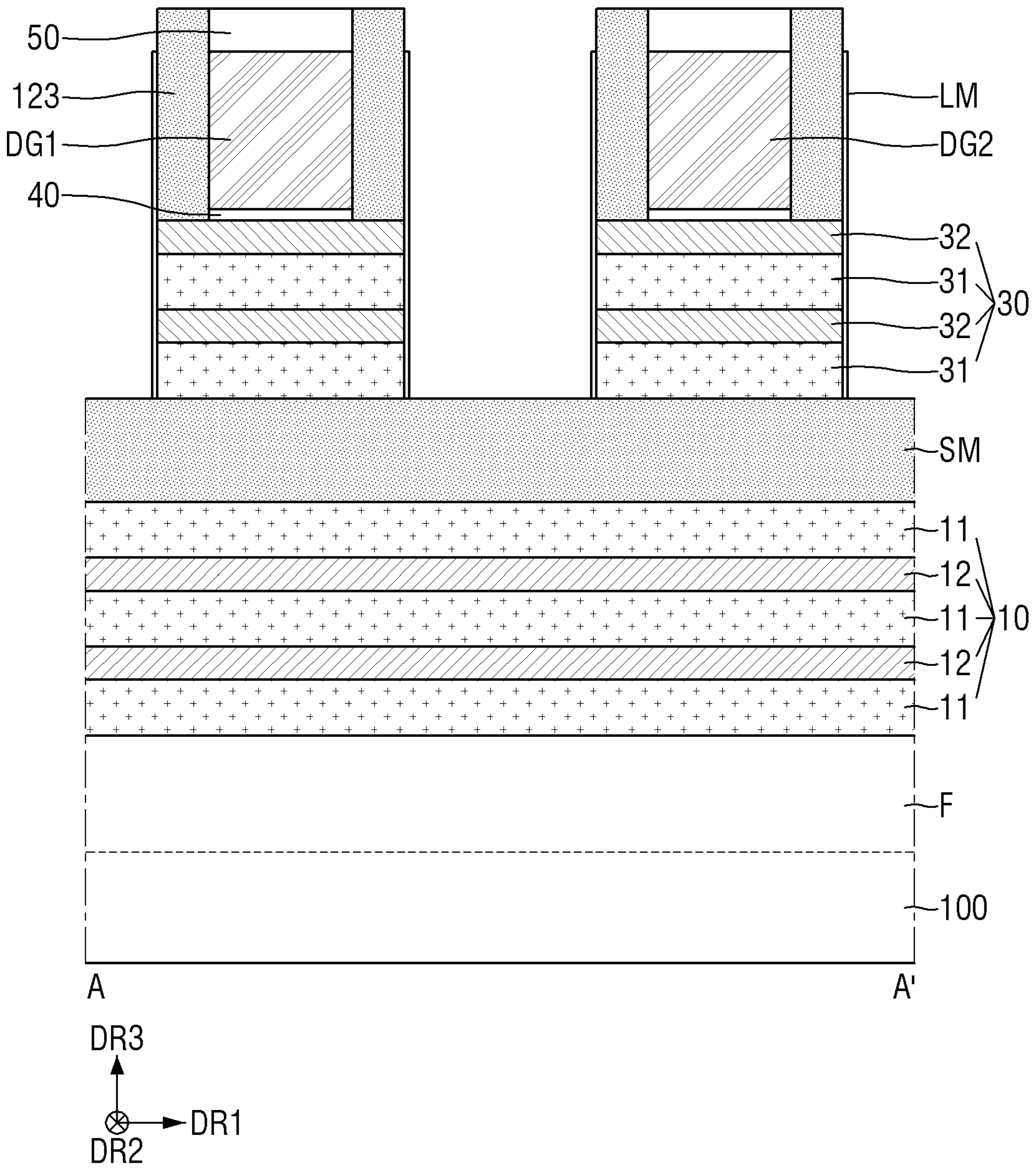

Referring to FIG. 27, the liner material layer LM may be partially removed using a dry etching process. In this case, a bottom portion and an upper portion of the liner material layer LM may be removed to expose at least a portion of the upper surface of the spacer material layer SM.

Figure 28:
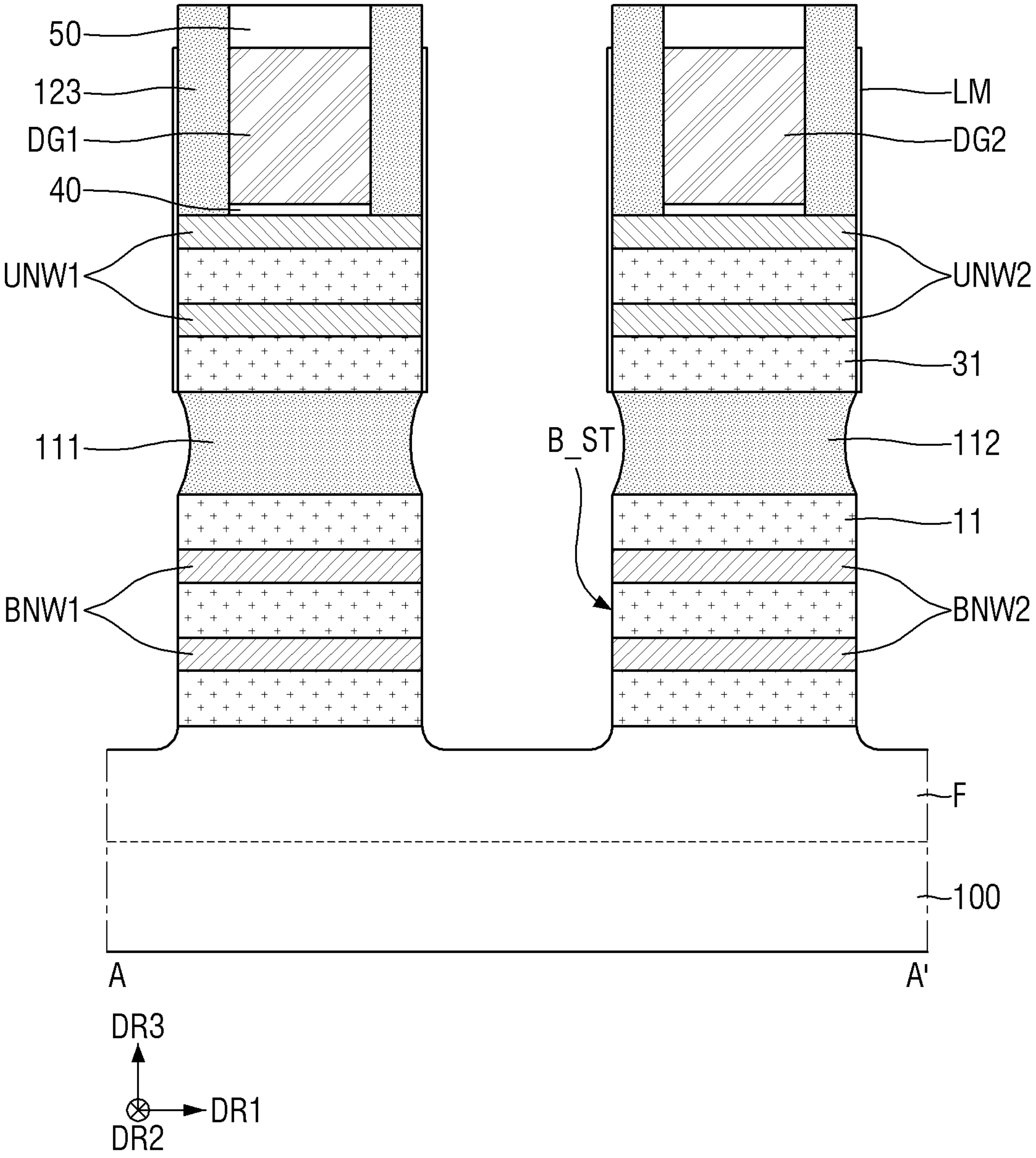

Referring to FIG. 28, a lower source/drain trench B_ST may be formed using the liner material layer LM. For example, a portion of the spacer material layer SM between the first stack structure 10 and the third stack structure 30 and a portion of the first stack structure 10 may be etched using the liner material layer LM to form the lower source/drain trench B_ST. In this case, a profile of a sidewall of the liner material layer LM and a profile of a sidewall of the lower source/drain trench B_ST may be substantially aligned with each other in the third direction DR3. However, the present disclosure is not limited thereto.

While the lower source/drain trench B_ST is formed, a portion of the dummy capping pattern 50 and a portion of the spacer material layer SM formed on an upper surface of the dummy capping pattern 50 may be removed. A portion of the spacer material layer SM remaining on the sidewall of each of the first and second dummy gates DG1 and DG2, and the remaining dummy capping pattern 50 may be defined as the gate spacer 123.

After the lower source/drain trench B_ST has been formed, the first semiconductor layers 12 and the second semiconductor layers 32 remaining under the first dummy gate DG1 may be respectively defined as the first plurality of lower nanosheets BNW1 and the first plurality of upper nanosheets UNW1. Further, after the lower source/drain trench B_ST has been formed, the first semiconductor layers 12 and the second semiconductor layers 32 remaining under the second dummy gate DG2 may be respectively defined as the second plurality of lower nanosheets BNW2 and the second plurality of upper nanosheets UNW2.

Further, after the lower source/drain trench B_ST has been formed, a portion of the spacer material layer SM remaining under the first dummy gate DG1 may be defined as the first isolation layer 111, while a portion of the spacer material layer SM remaining under the second dummy gate DG2 may be defined as the second isolation layer 112. That is, the first isolation layer 111 may be formed between the first plurality of lower nanosheets BNW1 and the first plurality of upper nanosheets UNW1, while the second isolation layer 112 may be formed between the second plurality of lower nanosheets BNW2 and the second plurality of upper nanosheets UNW2.

At least a portion of the spacer material layer SM may be removed in a wet etching process. Accordingly, the semiconductor device having the first and second isolation layers 111 and 112 as shown in FIGS. 1 to 8 may be formed.

Alternatively, a partial area of the spacer material layer SM may not be removed but may remain. Accordingly, the semiconductor device having the first and second isolation layers 111 and 112 as shown in FIGS. 9 to 15 may be formed.

Figure 29:
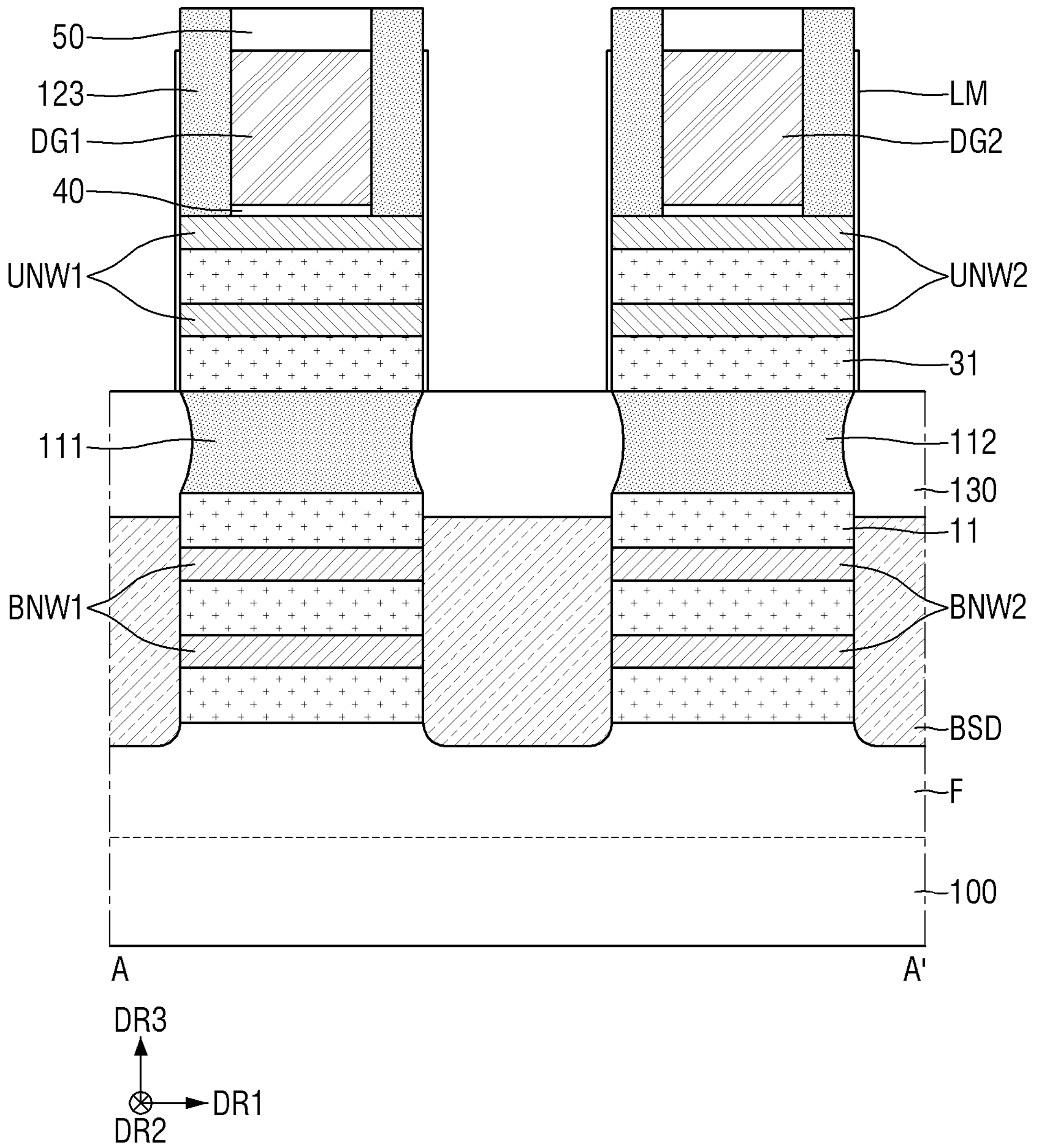

Referring to FIG. 29, the lower source/drain region BSD and the first interlayer insulating film 130 may be sequentially formed inside the lower source/drain trench (B_ST in FIG. 28).

For example, in the lower source/drain trench (B_ST in FIG. 28), the lower source/drain region BSD may be formed on sidewalls of each of the first and second plurality of lower nanosheets BNW1 and BNW2. For example, a vertical level in the third direction DR3 of an upper surface of the lower source/drain region BSD may be lower than that of an upper surface of each of the first isolation layer 111 and the second isolation layer 112.

Subsequently, the first interlayer insulating film 130 may be formed to cover the lower source/drain region BSD.

Figure 30:
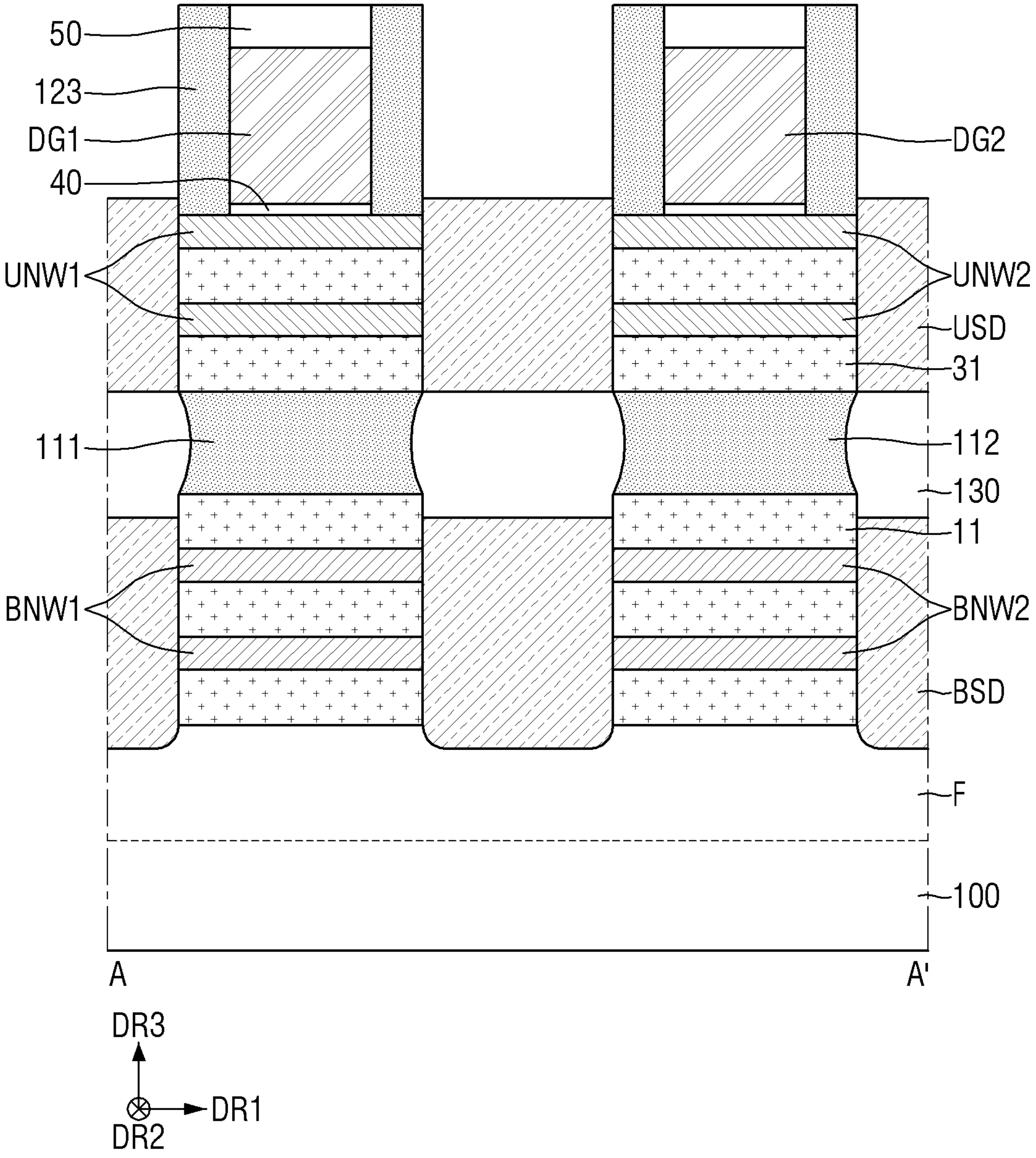

Referring to FIG. 30, the liner material layer LM may be removed, and the upper source/drain region USD may be formed on sidewalls of each of the first and second plurality of upper nanosheets UNW1 and UNW2.

In one example, the aforementioned liner material layer LM is interposed, such that volumes of the lower source/drain region BSD and the upper source/drain region USD may be different from each other. However, the present disclosure is not limited thereto, and the volumes of the lower source/drain region BSD and the upper source/drain region USD may be substantially equal to each other.

Figure 31:
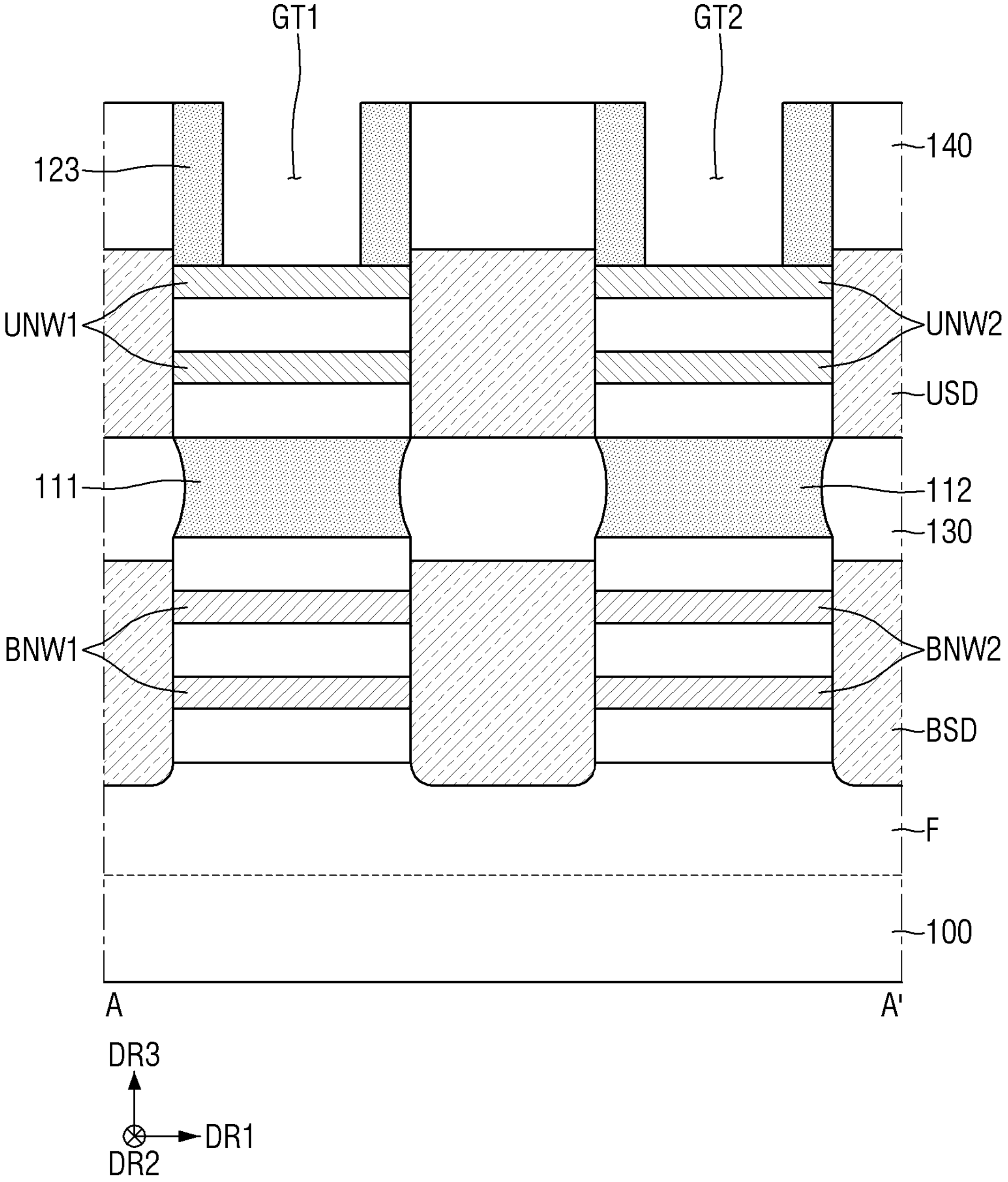
Figure 32:
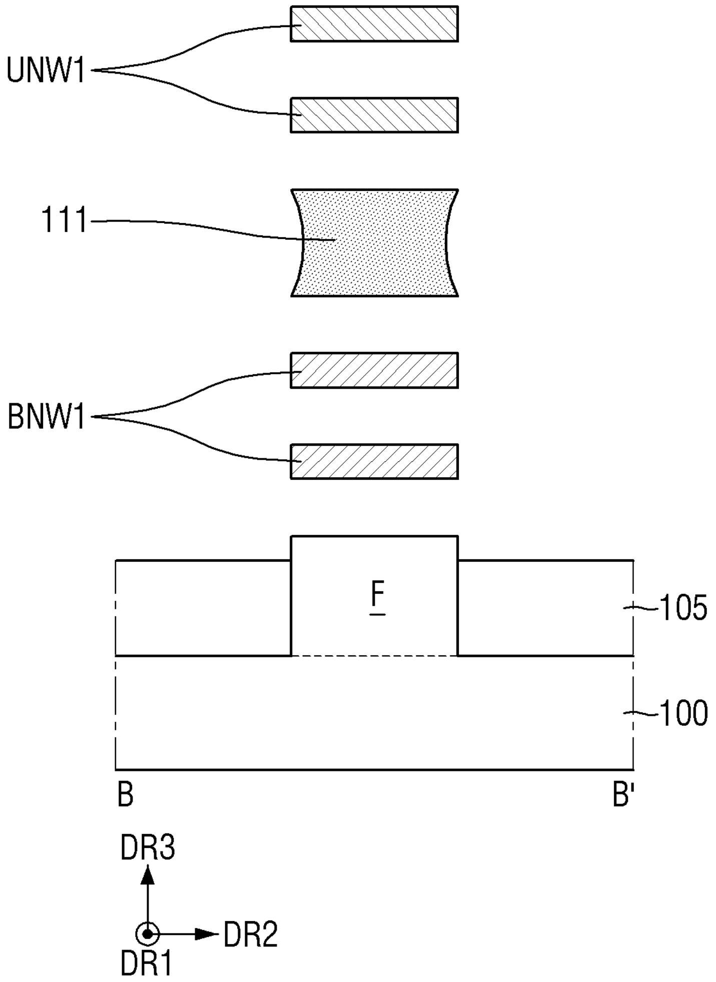

Referring to FIGS. 31 and 32, the second interlayer insulating film 140 may be formed to cover each of the upper source/drain region USD, the gate spacer 123 and the dummy capping pattern (50 in FIG. 30). Subsequently, an upper surface of each of the first and second dummy gates (DG1 and DG2 in FIG. 30) may be exposed via a planarization process. Subsequently, the first and second dummy gates (DG1 and DG2 in FIG. 30), the pad oxide film (40 in FIG. 30), the first sacrificial layer (11 in FIG. 30), and the third sacrificial layer (31 in FIG. 30) may be removed. A space defined by removing the first dummy gate (DG1 in FIG. 30) may be defined as a first gate trench GT1. A space defined by removing the second dummy gate (DG2 in FIG. 30) may be defined as a second gate trench GT2.

Figure 33:
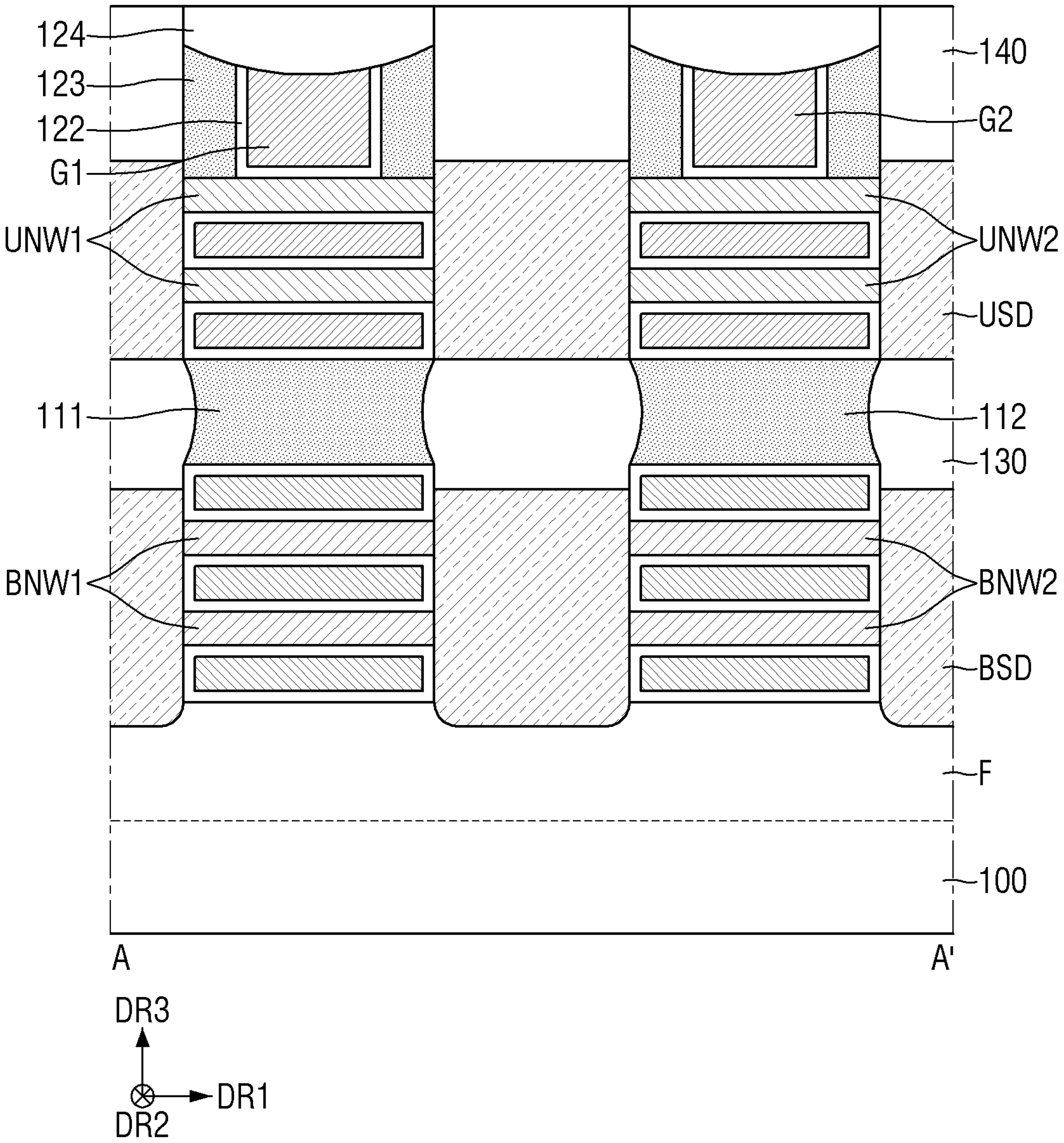
Figure 34:
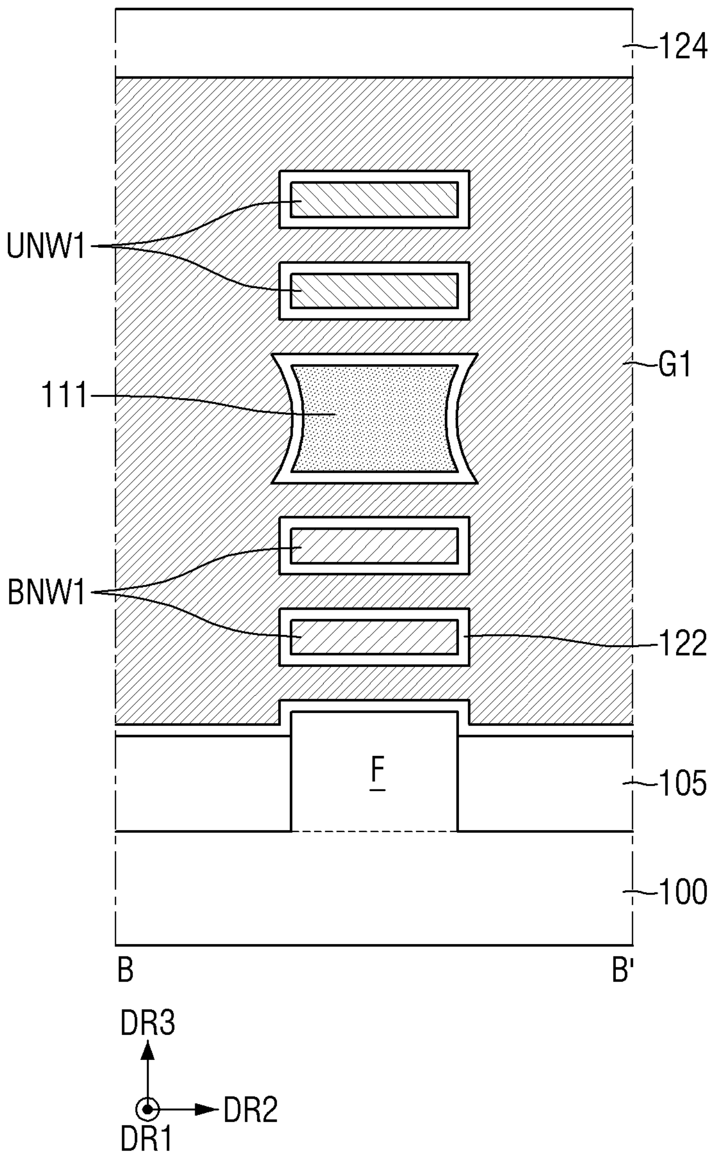

Referring to FIGS. 32 to 34, the gate insulating film 122 may be formed in areas in which the first and second dummy gates (DG1 and DG2 in FIG. 30), the first sacrificial layer (11 in FIG. 30) and the third sacrificial layer (31 in FIG. 30) have been removed, respectively. For example, the gate insulating film 122 may be conformally formed thereon.

Subsequently, the first gate electrode G1 surrounding the first plurality of lower nanosheets BNW1 and the first plurality of upper nanosheets UNW1 may be formed in an inner space of the first gate trench GT1 and in an area overlapping with the first gate trench GT1 in the third direction DR3. Further, the second gate electrode G2 surrounding the second plurality of lower nanosheets BNW2 and the second plurality of upper nanosheets UNW2 may be formed in an inner space of the second gate trench GT2 and in an area overlapping with the second gate trench GT2 in the third direction DR3. Subsequently, the capping pattern 124 may be formed on each of the first and second gate electrodes G1 and G2.

Referring to FIGS. 2 and 3, the source/drain contact CA may be formed which extends through the second interlayer insulating film 140 in the third direction DR3 and may be electrically connected to the upper source/drain region USD. The silicide layer 150 may be formed between the upper source/drain region USD and the source/drain contact CA. Further, the first gate contact CB1 may be formed which extends through the capping pattern 124 in the third direction DR3 and may be electrically connected to the first gate electrode G1. The second gate contact CB2 may be formed which extends through the capping pattern 124 in the third direction DR3 and may be electrically connected to the second gate electrode G2.

Subsequently, the etch stop film 160 and the third interlayer insulating film 170 may be sequentially formed on each of the second interlayer insulating film 140, the capping pattern 124, the source/drain contact CA, and the first and second gate contacts CB1, CB2. Then, the first via V1, the second via V2 and the third via V3 may be formed which may extend through the third interlayer insulating film 170 and the etch stop film 160 in the third direction DR3 and may be electrically connected to the first gate contact CB1, the second gate contact CB2 and the source/drain contact CA, respectively. In this manufacturing process, the semiconductor device as shown in FIGS. 2 and 3 may be manufactured.

Hereinafter, a semiconductor device according to some embodiments of the present disclosure will be described with reference to FIGS. 35 and 36. For convenience of description, the descriptions of the contents duplicate with the descriptions set forth above with reference to FIGS. 1 to 34 may be omitted. Further, in FIGS. 35 and 36, the descriptions of the first gate contact CB1, the first via V1, the capping pattern 124, the etch stop film 160 and the third interlayer insulating film 170 may be omitted for convenience of description.

Figure 35:
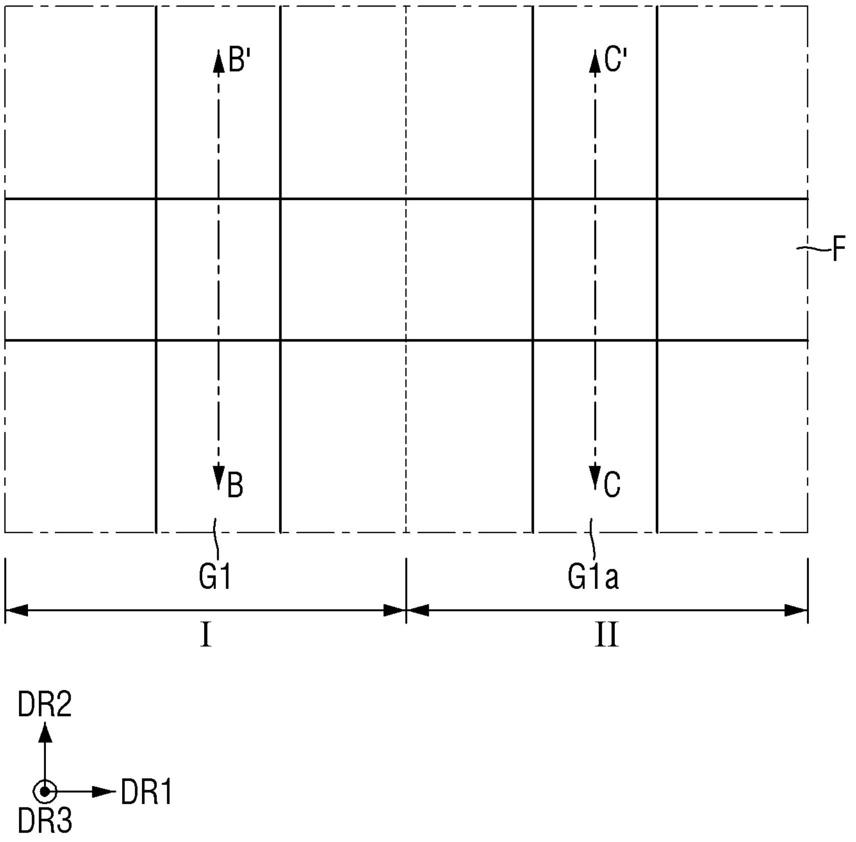
FIG. 35 is a layout diagram for illustrating a semiconductor device according to some embodiments of the present disclosure.

FIG. 35 is a layout diagram for illustrating a semiconductor device according to some embodiments of the present disclosure. FIG. 36 is a cross-section view cut along lines B-B' and C-C' of FIG. 35.

Figure 36:
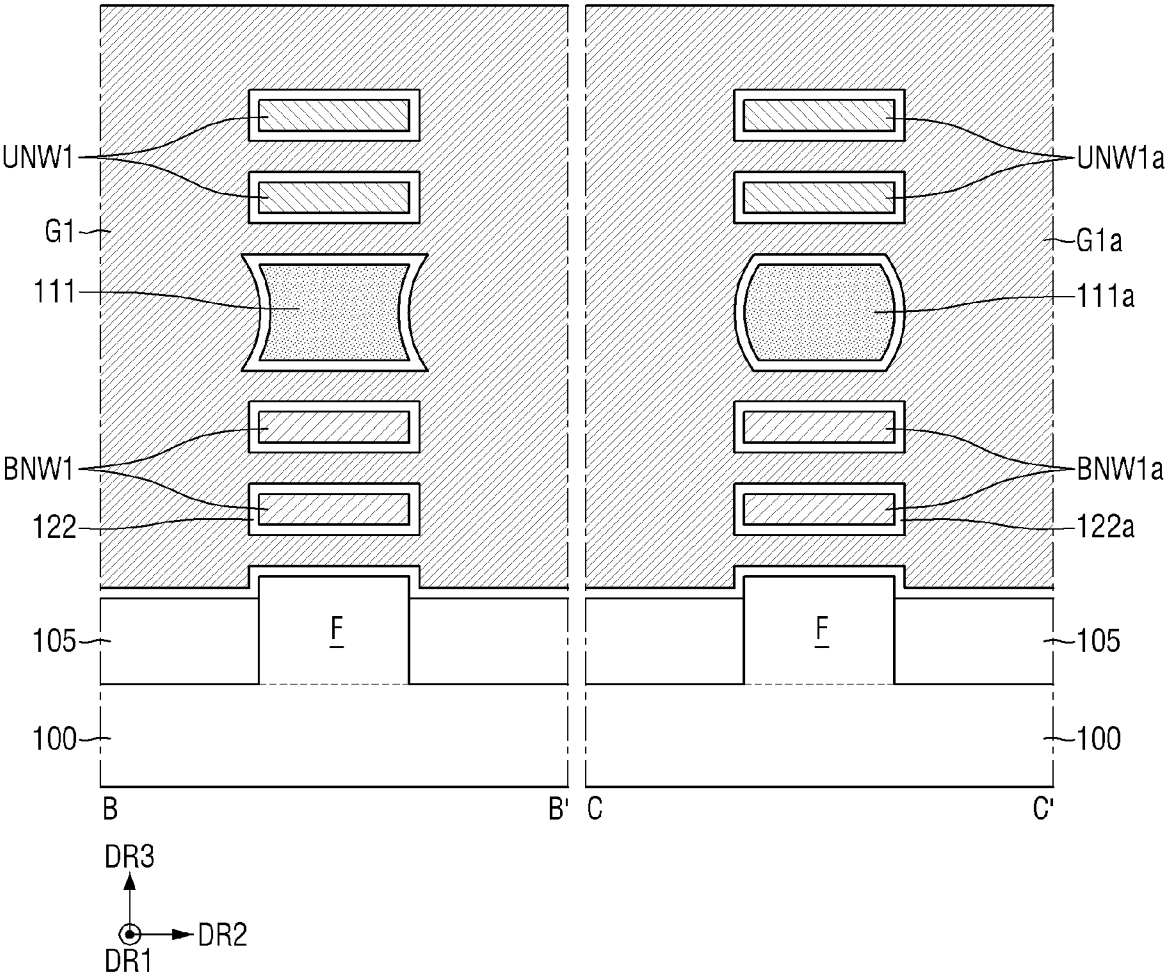
FIG. 36 is a cross-section view cut along lines B-B' and C-C' of FIG. 35.

Referring to FIGS. 35 and 36, the substrate 100 may include a first area I and a second area II spaced apart from the first area I in the first direction DR1.

A first plurality of lower nanosheets BNW1, a first plurality of upper nanosheets UNW1, a first isolation layer 111 disposed between the first plurality of lower nanosheets BNW1 and the first plurality of upper nanosheets UNW1, and a first gate electrode G1 may be disposed in the first area I.

A first-a plurality of lower nanosheets BNW1a, a first-a plurality of upper nanosheets UNW1a, a first-a isolation layer 111*a* disposed between the first-a plurality of lower nanosheets BNW1a and the first-a plurality of upper nanosheets UNW1a, and a first-a gate electrode G1a may be disposed in the second area II.

An inclination of the sidewall of the first isolation layer 111 may be different from an inclination of the sidewall of the first-a isolation layer 111*a*. A profile of the sidewall of the first isolation layer 111 may be concave, while a profile of the sidewall of the first-a isolation layer 111*a* may be convex. However, the present disclosure is not limited thereto.

The sidewall of the first isolation layer 111 may be recessed inwardly of the first isolation layer 111, while the sidewall of the first-a isolation layer 111*a* may protrude outwardly of the first-a isolation layer 111*a*.

A width of the first isolation layer 111 may be the largest at a vertical level closest to each of a stack of the first plurality of lower nanosheets BNW1 and a stack of the first plurality of upper nanosheets UNW1. For example, the width of the first isolation layer 111 may be the largest at a first level in a third direction DR3 thereof closest to the stack of the first plurality of lower nanosheets BNW1 and/or at a second level in the third direction DR3 thereof closest to the stack of the first plurality of upper nanosheets UNW1. For example, the width of the first isolation layer 111 may be the smallest at a third level in the third direction DR3 thereof that is located halfway between the stack of the first plurality of lower nanosheets BNW1 and the stack of the first plurality of upper nanosheets UNW1.

A width of the first-a isolation layer 111*a* may be the smallest at a vertical level closest to each of the stack of the first-a plurality of lower nanosheets BNW1a and a stack of the first-a plurality of upper nanosheets UNW1a. For example, the width of the first-a isolation layer 111*a* may be the smallest at a fourth level in the third direction DR3 thereof closest to the stack of the first-a plurality of lower nanosheets BNW1a and/or at a fifth level in the third direction DR3 thereof closest to the stack of the first-a plurality of upper nanosheets UNW1a. For example, the width of the first-a isolation layer 111*a* may be the largest at a sixth level in the third direction DR3 thereof that is located halfway between the stack of the first-a plurality of lower nanosheets BNW1a and the stack of the first-a plurality of upper nanosheets UNW1a.

The first level in the third direction DR3 may be the same as the fourth level in the third direction DR3. The second level in the third direction DR3 may be the same as the fifth level in the third direction DR3. The third level in the third direction DR3 may be the same as the sixth level in the third direction DR3. However, the present disclosure is not limited thereto.

Although the embodiments according to the present disclosure have been described above with reference to the accompanying drawings, the present disclosure is not limited to the embodiments, but may be implemented in various different forms. Those of ordinary skill in the art will be able to understand that the present disclosure may be implemented in other specific forms without changing the scope of the present invention. Therefore, it should be understood that the embodiments as described above are not restrictive but illustrative in all respects.

What is claimed is:

1. A semiconductor device comprising:

an active pattern on a substrate and extending in a first direction;

a first plurality of lower nanosheets spaced apart from each other in a second direction intersecting the first direction and on the active pattern;

a second plurality of lower nanosheets spaced apart from each other in the second direction and on the active pattern;

a first isolation layer on the first plurality of lower nanosheets and spaced apart from the first plurality of lower nanosheets in the second direction;

a second isolation layer on the second plurality of lower nanosheets and spaced apart from the second plurality of lower nanosheets in the second direction;

a first plurality of upper nanosheets spaced apart from each other in the second direction and on the first isolation layer;

a second plurality of upper nanosheets spaced apart from each other in the second direction and on the second isolation layer; and a first gate electrode on the substrate and surrounding each of the first plurality of lower nanosheets, the first isolation layer, and the first plurality of upper nanosheets;

wherein a sidewall of the first isolation layer has a first curved shape, and a sidewall of the second isolation layer has a second curved shape different from the first curved shape.

2. The semiconductor device of claim 1, wherein a width of the first isolation layer decreases when moving in the second direction toward a point located halfway between a stack of the first plurality of lower nanosheets and a stack of the first plurality of upper nanosheets.

3. The semiconductor device of claim 1, wherein a width of the second isolation layer increases when moving in the second direction toward a point located halfway between a stack of the second plurality of lower nanosheets and a stack of the second plurality of upper nanosheets.

4. The semiconductor device of claim 1, wherein an inclination angle of the sidewall of the first isolation layer, with respect to a top face of the first isolation layer, continuously decreases as the first isolation layer extends in the second direction from an area adjacent to the first plurality of upper nanosheets to an area adjacent to the first plurality of lower nanosheets.

5. The semiconductor device of claim 1, wherein an inclination angle of the sidewall of the second isolation layer, with respect to a top face of the second isolation layer, continuously increases as the second isolation layer extends in the second direction from an area adjacent to the second plurality of upper nanosheets to an area adjacent to the second plurality of lower nanosheets.

6. The semiconductor device of claim 1, wherein the sidewall of the first isolation layer is recessed inwardly of the first isolation layer.

7. The semiconductor device of claim 1, wherein the sidewall of the second isolation layer protrudes outwardly of the second isolation layer.

8. The semiconductor device of claim 1, further comprising:

a lower source/drain region on the active pattern and sidewalls of the first plurality of lower nanosheets; and an upper source/drain region on sidewalls of the first plurality of upper nanosheets and spaced apart from the lower source/drain region in the second direction, wherein each of the lower source/drain region and the upper source/drain region does not contact the first isolation layer.

9. The semiconductor device of claim 8, wherein the first plurality of lower nanosheets and the first gate electrode are alternately stacked with each other to constitute a lower structure, wherein the first plurality of upper nanosheets and the first gate electrode are alternately stacked with each other to constitute an upper structure, and wherein a thickness of the lower structure in the second direction is different from a thickness of the upper structure in the second direction.

10. The semiconductor device of claim 1, further comprising a source/drain region on the active pattern and sidewalls of the first plurality of upper nanosheets.

11. The semiconductor device of claim 10, wherein the active pattern constitutes a lower structure, wherein the first plurality of upper nanosheets and the first gate electrode are alternately stacked with each other to constitute an upper structure, and wherein a thickness of the lower structure in the second direction is different from a thickness of the upper structure in the second direction.

12. A semiconductor device comprising:

an active pattern on a substrate and extending in a first horizontal direction;

a first plurality of lower nanosheets spaced apart from each other in a vertical direction from the substrate and on the active pattern;

a second plurality of lower nanosheets spaced apart from each other in the vertical direction from the substrate and on the active pattern;

a first isolation layer on the first plurality of lower nanosheets and spaced apart from the first plurality of lower nanosheets in the vertical direction;

a second isolation layer on the second plurality of lower nanosheets and spaced apart from the second plurality of lower nanosheets in the vertical direction;

a first plurality of upper nanosheets spaced apart from each other in the vertical direction and on the first isolation layer;

a second plurality of upper nanosheets spaced apart from each other in the vertical direction and on the second isolation layer; and a first gate electrode on the substrate and extending in a second horizontal direction intersecting the first horizontal direction, wherein the first gate electrode surrounds each of the first plurality of lower nanosheets, the first isolation layer, and the first plurality of upper nanosheets, wherein a width of the first isolation layer in the second horizontal direction is the smallest or largest at both a first vertical level thereof closest to a stack of the first plurality of lower nanosheets and and/or at a second vertical level thereof closest to a stack of the first plurality of upper nanosheets and a width of the second isolation layer in the second horizontal direction is the largest at both a third vertical level thereof closest to a stack of the second plurality of lower nanosheets and at a fourth vertical level thereof closest to a stack of the second plurality of upper nanosheets.

13. The semiconductor device of claim 12, wherein the width of the second isolation layer decreases when moving in the vertical direction toward a point located halfway between the stack of the second plurality of lower nanosheets and the stack of the second plurality of upper nanosheets.

14. The semiconductor device of claim 12, wherein the width of the first isolation layer increases when moving in the vertical direction toward a point located halfway between the stack of the first plurality of lower nanosheets and the stack of the first plurality of upper nanosheets.

15. The semiconductor device of claim 12, further comprising:

a lower source/drain region on the active pattern and on sidewalls of the first plurality of lower nanosheets; and an upper source/drain region on sidewalls of the first plurality of upper nanosheets and spaced apart from the lower source/drain region in the vertical direction.

16. The semiconductor device of claim 12, further comprising:

a source/drain region on the active pattern and on sidewalls of the first plurality of upper nanosheets; and an insulating layer interposed between the source/drain region and the active pattern.

17. The semiconductor device of claim 12, further comprising a gate insulating film between the first gate electrode and the first plurality of lower nanosheets, between the first gate electrode and the first plurality of upper nanosheets, and between the first gate electrode and the first isolation layer.

18. A semiconductor device comprising:

a substrate;

an active pattern on the substrate and extending in a first horizontal direction, wherein the active pattern protrudes from the substrate in a vertical direction;

a first plurality of lower nanosheets spaced apart from each other in the vertical direction and on the active pattern;

a second plurality of lower nanosheets spaced apart from each other in the vertical direction and on the active pattern, wherein the first plurality of lower nanosheets are spaced apart from the second plurality of lower nanosheets in the first horizontal direction;

a first plurality of upper nanosheets spaced apart from each other in the vertical direction and on the first plurality of lower nanosheets, wherein the first plurality of upper nanosheets are spaced apart from the first plurality of lower nanosheets in the vertical direction;

a second plurality of upper nanosheets spaced apart from each other in the vertical direction and on the second plurality of lower nanosheets, wherein the second plurality of upper nanosheets are spaced apart from the second plurality of lower nanosheets in the vertical direction;

a first isolation layer between the first plurality of lower nanosheets and the first plurality of upper nanosheets;

a second isolation layer between the second plurality of lower nanosheets and the second plurality of upper nanosheets, wherein the first isolation layer and the second isolation layer are spaced apart from each other in the first horizontal direction;

a first gate electrode on the active pattern and extending in a second horizontal direction different from the first horizontal direction, wherein the first gate electrode surrounds each of the first plurality of lower nanosheets, the first isolation layer, and the first plurality of upper nanosheets; and a second gate electrode on the active pattern and extending in the second horizontal direction, wherein the second gate electrode is spaced apart from the first gate electrode in the first horizontal direction, wherein the second gate electrode surrounds each of the second plurality of lower nanosheets, the second isolation layer, and the second plurality of upper nanosheets, wherein an inclination angle of a sidewall of the first isolation layer is different from an inclination angle of a sidewall of the second isolation layer, wherein the sidewall of the first isolation layer has a first curved shape, and wherein the sidewall of the second isolation layer has a different type of curvature from the first curved shape.

19. The semiconductor device of claim 18, wherein the sidewall of the first isolation layer has a concave shape, and wherein the sidewall of the second isolation layer has a convex shape.

20. The semiconductor device of claim 18, wherein the first isolation layer has a largest width at a first vertical level thereof closest to a stack of the first plurality of lower nanosheets and/or at a second vertical level thereof closest to a stack of the first plurality of upper nanosheets, and wherein the second isolation layer has a smallest width at a third vertical level thereof closest to a stack of the second plurality of lower nanosheets and/or at a fourth vertical level thereof closest to a stack of the second plurality of upper nanosheets.

* * * * *